US012701936B2

(12) United States Patent
Nakatani et al.

(10) Patent No.: US 12,701,936 B2
(45) Date of Patent: Aug. 4, 2026

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Kimihiko Nakatani, Toyama (JP); Takashi Nakagawa, Toyama (JP); Takayuki Waseda, Toyama (JP); Motomu Degai, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 1226 days.

(21) Appl. No.: 17/200,273

(22) Filed: Mar. 12, 2021

(65) Prior Publication Data

US 2021/0305043 A1 Sep. 30, 2021

(30) Foreign Application Priority Data

Mar. 25, 2020 (JP) ................................ 2020-055107

(51) Int. Cl.
*H10P 14/60* (2026.01)
*H10P 14/692* (2026.01)
(Continued)

(52) U.S. Cl.
CPC ...... *H10P 14/6681* (2026.01); *H10P 14/6512* (2026.01); *H10P 14/69215* (2026.01); *H10P 14/69433* (2026.01); *H10P 72/0402* (2026.01)

(58) Field of Classification Search
CPC ............. H10P 14/6681; H10P 14/6512; H10P 14/69215; H10P 14/69433; H10P 72/0402;
(Continued)

(56) References Cited

U.S. PATENT DOCUMENTS

| | | | |
|---|---|---|---|
| 5,194,530 | A | 3/1993 | Stevens et al. |
| 8,013,021 | B2 | 9/2011 | Macqueen et al. |

(Continued)

FOREIGN PATENT DOCUMENTS

| | | | |
|---|---|---|---|
| CN | 110226214 | A | 9/2019 |
| CN | 110892508 | A | 3/2020 |

(Continued)

OTHER PUBLICATIONS

Japanese Office Action issued on Jul. 19, 2022 for Japanese Patent Application No. 2020-055107.

(Continued)

*Primary Examiner* — Gordon Baldwin
*Assistant Examiner* — Christina D Mcclure
(74) *Attorney, Agent, or Firm* — Volpe Koenig

(57) ABSTRACT

There is provided a technique that includes: modifying a surface of first base exposed on a substrate by supplying modifying gas including the first base and second base exposed on the substrate; and selectively forming a film containing at least first element and second element different from the first element on a surface of the second base by supplying precursor gas to the substrate after the surface of the first base is modified, under condition that film-forming reaction by thermal decomposition of the precursor gas does not substantially occur, the precursor gas containing a compound in which atoms of the first element are contained in one molecule, at least one atom of the second element is interposed between two atoms of the first element, and each of the two atoms of the first element is directly bonded to one of the at least one atom of the second element.

14 Claims, 7 Drawing Sheets

(51) Int. Cl.
*H10P 14/694* (2026.01)
*H10P 72/00* (2026.01)

(58) Field of Classification Search
CPC .. H10P 14/61; H10P 14/6339; H10P 14/6546; H10P 14/20; H10P 14/36; H10P 14/65; H10P 72/0468; H10P 14/00; C23C 16/345; C23C 16/401; C23C 16/45525; C23C 16/04
See application file for complete search history.

(56) References Cited

U.S. PATENT DOCUMENTS

| | | | | |
|---|---|---|---|---|
| 9,793,107 | B2 | 10/2017 | Noda et al. | |
| 2003/0188682 | A1* | 10/2003 | Tois | C23C 16/402 257/E21.279 |
| 2005/0287728 | A1 | 12/2005 | Arias | |
| 2014/0170858 | A1 | 6/2014 | Harada et al. | |
| 2014/0287595 | A1 | 9/2014 | Shimamoto et al. | |
| 2014/0287596 | A1 | 9/2014 | Hirose et al. | |
| 2015/0072537 | A1 | 3/2015 | Noda et al. | |
| 2015/0332916 | A1 | 11/2015 | Noda et al. | |
| 2016/0024659 | A1 | 1/2016 | Shimamoto et al. | |
| 2016/0225617 | A1 | 8/2016 | Noda et al. | |
| 2016/0284542 | A1 | 9/2016 | Noda et al. | |
| 2017/0207082 | A1 | 7/2017 | Wang et al. | |
| 2017/0278705 | A1 | 9/2017 | Murakami et al. | |
| 2017/0342553 | A1 | 11/2017 | Yu et al. | |
| 2018/0012752 | A1 | 1/2018 | Tapily | |
| 2018/0199432 | A1 | 7/2018 | Thompson et al. | |
| 2018/0202042 | A1 | 7/2018 | Fafard et al. | |
| 2018/0204732 | A1 | 7/2018 | Kamakura et al. | |
| 2018/0211833 | A1* | 7/2018 | Li | C23C 16/4583 |
| 2018/0218898 | A1 | 8/2018 | Hirose et al. | |
| 2018/0233349 | A1 | 8/2018 | Smith et al. | |
| 2018/0254179 | A1 | 9/2018 | Chan et al. | |
| 2018/0315840 | A1 | 11/2018 | Chui et al. | |
| 2019/0218666 | A1 | 7/2019 | Harada et al. | |
| 2019/0326114 | A1* | 10/2019 | Kachian | H01L 21/02639 |
| 2019/0341476 | A1 | 11/2019 | Chui et al. | |
| 2020/0140995 | A1 | 5/2020 | Blanquart | |
| 2020/0234943 | A1 | 7/2020 | Bhuyan et al. | |
| 2021/0043448 | A1 | 2/2021 | Li et al. | |
| 2021/0074584 | A1 | 3/2021 | Tapily | |
| 2021/0143001 | A1 | 5/2021 | Ashihara et al. | |
| 2021/0166948 | A1 | 6/2021 | Degai et al. | |
| 2021/0272803 | A1 | 9/2021 | Nakatani et al. | |
| 2021/0305043 | A1 | 9/2021 | Nakatani et al. | |

FOREIGN PATENT DOCUMENTS

| | | | |
|---|---|---|---|
| JP | 2013-243193 | A | 12/2013 |
| JP | 2014-135475 | A | 7/2014 |
| JP | 2014-183218 | A | 9/2014 |
| JP | 2015-053445 | A | 3/2015 |
| JP | 2017-130665 | A | 7/2017 |
| JP | 2017-174919 | A | 9/2017 |
| JP | 2017-222928 | A | 12/2017 |
| JP | 2018-125416 | A | 8/2018 |
| JP | 2018-523289 | A | 8/2018 |
| JP | 2018-523917 | A | 8/2018 |
| JP | 2019-096877 | A | 6/2019 |
| KR | 2015-0029517 | A | 3/2015 |
| KR | 10-2018-0038473 | A | 4/2018 |
| KR | 10-2018-0120062 | A | 11/2018 |
| KR | 2019-0101508 | A | 8/2019 |
| KR | 10-2020-0019271 | A | 2/2020 |
| SG | 10202013019 | | 7/2021 |
| TW | 1540643 | B | 7/2016 |
| WO | 2018-088003 | A1 | 5/2018 |
| WO | 2019/018379 | A1 | 1/2019 |
| WO | 2019/027738 | A1 | 2/2019 |
| WO | 2020/016914 | A1 | 1/2020 |
| WO | 2020/016915 | A1 | 1/2020 |

OTHER PUBLICATIONS

Japanese Office Action issued on Feb. 1, 2022 for Japanese Patent Application No. 2020-055107.
United States Office Action issued on Feb. 16, 2023 for U.S. Appl. No. 17/132,608.
Ushakova Alexandra, et al., "Study of the Radical Chain Mechanism of Hydrocarbon Oxidation for In Situ Combustion Process". Journal of Combustion, vol. 2017, Article ID 2526596, p. 1-11.
Mameli, Alfredo, et al., Area-Selective Atomic Layer Deposition of SiO2 Acetylacetone as a Chemoselective Inhibitor in an ABC-Type Cycle. ACS Nano, 2017, 11, 9303-9311.
Mackus, Adriaan J.M., et al., "From the Bottom-Up: Toward Area-Selective Atomic Layer Deposition with High Selectivity". Chemistry of Materials 2019, 31, 2-12.
Korean Office Action issued on Nov. 9, 2022 for Korean Patent Application No. 10-2020-0182802.
Japanese Office Action issued on Feb. 8, 2022 for Japanese Patent Application No. 2019-237905.
Singapore Written Opinion issued on Aug. 30, 2022 for Singapore Patent Application No. 10202013019Q.
Singapore Search Report issued on Nov. 1, 2021 for Singapore Patent Application No. 10202013019Q.
Singapore Written Opinion issued on Nov. 1, 2021 for Singapore Patent Application No. 10202013019Q.
Taiwan Office Action issued on Aug. 13, 2021 for Taiwan Patent Application No. 109141041.
Singapore Search Report Issued On Feb. 10, 2022 For Singapore Patent Application No. 10202102589W.
Singapore Written Opinion Issued On Feb. 10, 2022 For Singapore Patent Application No. 10202102589W.
Korean Office Action issued on Nov. 25, 2022 for Korean Patent Application No. 10-2021-0033356.
Taiwan Office Action issued on Jan. 27, 2022 for Taiwan Patent Application No. 110102617 .
Chinese Office Action issued on Jul. 27, 2023 for Chinese Patent Application No. 202110181042.X.
Office Action issued on Feb. 5, 2024 for Chinese Patent Application No. 202110181042.X.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2020-055107, filed on Mar. 25, 2020, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, a process of selectively growing and forming a film on a surface of a specific base among a plurality of types of bases exposed on a surface of a substrate (hereinafter, this process is also hereinafter referred to as selective growth or selective film formation) may be often carried out.

In the selective growth, before the film is selectively grown on the surface of the specific base, a process of modifying a surface of a base on which no film is desired to be grown and suppressing a film from being grown on the modified surface may be performed.

However, in this case, when the selective growth is continuously performed for a predetermined time, selection loss may occur, which may lead to growth of a film on the modified surface. Factors that cause the selection loss may include, for example: 1. on the surface of the base, an adsorption site in a region which has not been completely modified reacts with a film-forming gas; and 2. the modified surface reacts with the film-forming gas to destroy the modified surface, such that the growth of a film cannot be suppressed.

In the case where the selection loss occurs, desired selectivity in the selective growth may not be obtained. Further, in the case where the selection loss occurs, a step of etching a film grown on the modified surface to expose the surface of the base on which no film is desired to be grown and then modifying the exposed surface again needs be performed. As a result, a processing time for the selective growth may increase to lower a throughput, thereby lowering a productivity.

SUMMARY

Some embodiments of the present disclosure provide a technique capable of improving selectivity and productivity in selective growth.

According to some embodiments of the present disclosure, there is provided a technique that includes: (a) modifying a surface of a first base exposed on a surface of a substrate by supplying a modifying gas to the substrate including the first base and a second base exposed on the surface of the substrate; and (b) selectively forming a film containing at least a first element and a second element different from the first element on a surface of the second base by supplying a precursor gas to the substrate after the surface of the first base is modified, under a condition that a film-forming reaction by thermal decomposition of the precursor gas does not substantially occur, the precursor gas containing a compound in which two or more atoms of the first element are contained in one molecule, at least one atom of the second element is interposed between two atoms of the first element, and each of the two atoms of the first element is directly bonded to one of the at least one atom of the second element.

BRIEF DESCRIPTION OF DRAWINGS

The accompanying drawings, which are incorporated in and constitute a part of the specification, illustrate some embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments

Embodiments of the Present Disclosure

Some embodiments of the present disclosure will be now described mainly with reference to FIGS. 1 to 4 and FIGS. 5A to 5E.

(1) Configuration of Substrate Processing Apparatus

Figure 1:
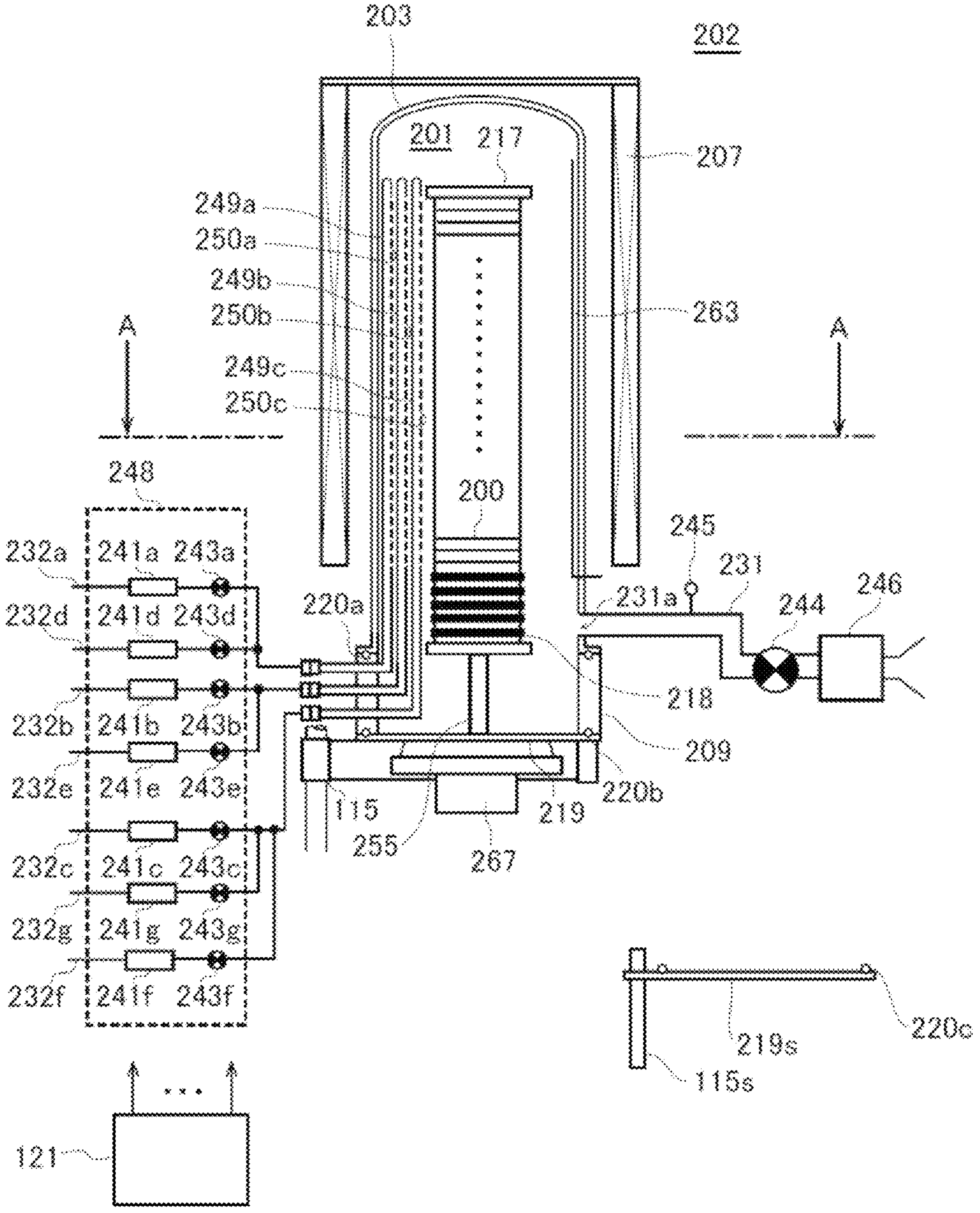
FIG. 1 is a schematic configuration diagram of a vertical type process furnace of a substrate processing apparatus suitably used in some embodiments of the present disclosure, in which a portion of the process furnace 202 is shown in a vertical cross-sectional view.

As illustrated in FIG. 1, a process furnace 202 includes a heater 207 as a heating mechanism (temperature regulation part). The heater 207 has a cylindrical shape and is supported by a holding plate to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220*a* as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to be capable of accommodating wafers 200 as substrates. The processing of the wafers 200 is performed in the process chamber 201.

Nozzles 249*a* to 249*c* as first to third supply parts are installed in the process chamber 201 to penetrate a sidewall of the manifold 209. The nozzles 249*a* to 249*c* will also be referred to as first to third nozzles, respectively. The nozzles 249*a* to 249*c* are each made of a heat resistant material such as quartz or SiC. Gas supply pipes 232*a* to 232*c* are respectively connected to the nozzles 249*a* to 249*c*. The nozzles 249*a* to 249*c* are different nozzles, in which each of the nozzles 249*a* and 249*c* is installed adjacent to the nozzle 249*b*.

Mass flow controllers (MFCs) 241*a* to 241*c*, which are flow rate controllers (flow rate control parts), and valves 243*a* to 243*c*, which are opening/closing valves, are installed at the gas supply pipes 232*a* to 232*c* sequentially from corresponding upstream sides of gas flow, respectively. Gas supply pipes 232*d* and 232*e* are respectively connected to the gas supply pipes 232*a* and 232*b* at the downstream side of the valves 243*a* and 243*b*. Gas supply pipes 232*f* and 232*g* are respectively connected to the gas supply pipe 232*c* at the downstream side of the valve 243*c*. MFCs 241*d* to 241*g* and valves 243*d* to 243*g* are installed at the gas supply pipes 232*d* to 232*g* sequentially from corresponding upstream sides of gas flow, respectively. The gas supply pipes 232*a* to 232*g* are made of, for example, a metal material such as stainless steel (SUS).

Figure 2:
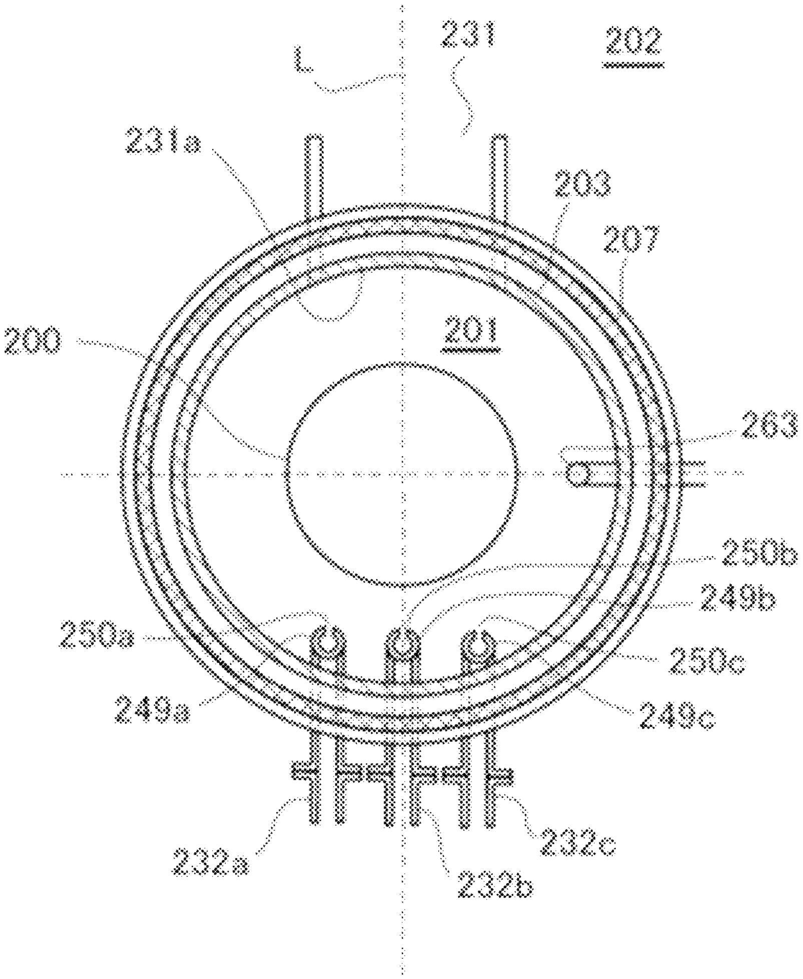
FIG. 2 is a schematic configuration diagram of the vertical type process furnace of the substrate processing apparatus suitably used in some embodiments of the present disclosure, in which a portion of the process furnace 202 is shown in a cross-sectional view taken along a line A-A in FIG. 1.

As illustrated in FIG. 2, the nozzles 249*a* to 249*c* are disposed in a space with an annular plan-view shape between the inner wall of the reaction tube 203 and the wafers 200 such that the nozzles 249*a* to 249*c* extend upward along an arrangement direction of the wafers 200 from a lower portion to an upper portion of the inner wall of the reaction tube 203. Specifically, the nozzles 249*a* to 249*c* are respectively installed at a lateral side of a wafer arrangement region in which the wafers 200 are arranged, namely in a region which horizontally surrounds the wafer arrangement region, to extend along the wafer arrangement region. The nozzle 249*b* is disposed to face an exhaust port 231*a* to be described below, on a straight line in a plane view, with centers of the wafers 200 loaded into the process chamber 201 interposed therebetween. The nozzles 249*a* and 249*c* are disposed to sandwich a straight line L passing through the nozzle 249*b* and a center of the exhaust port 231*a* from both sides along the inner wall of the reaction tube 203 (an outer peripheral portion of the wafers 200). The straight line L is also a straight line passing through the nozzle 249*b* and the centers of the wafers 200. That is, it may be said that the nozzle 249*c* is installed at the opposite side of the nozzle 249*a* with the straight line L interposed therebetween. The nozzles 249*a* and 249*c* are disposed in line symmetry with the straight line L as a symmetry axis. Gas supply holes 250*a* to 250*c* configured to supply a gas are installed on the side surfaces of the nozzles 249*a* to 249*c*, respectively. The gas supply holes 250*a* to 250*c* are respectively opened to face the exhaust port 231*a* in the plane view, thus allowing a gas to be supplied toward the wafers 200. The gas supply holes 250*a* to 250*c* may be formed in a plural number between the lower portion and the upper portion of the reaction tube 203.

As a precursor gas which is a film-forming gas, for example, a gas of a compound containing, for example, a first element, which is a main element constituting a film formed on a wafer 200, and a second element different from the first element, in which two or more atoms of the first element are contained in one molecule, at least one atom of the second element is interposed between two atoms of the first element, and each of the two atoms of the first element is directly bonded to one of the at least one atom of the second element, is supplied from the gas supply pipe 232*a* into the process chamber 201 via the MFC 241*a*, the valve 243*a*, and the nozzle 249*a*. An example of the atom of the first element may include a silicon (Si) atom, a germanium (Ge) atom, or a tetravalent metal atom. An example of the tetravalent metal atom may include a titanium (Ti) atom, a zirconium (Zr) atom, a hafnium (Hf) atom, a molybdenum (Mo) atom, a tungsten (W) atom, and the like. An example of the atom of the second element may include a nitrogen (N) atom, an oxygen (O) atom, or a carbon (C) atom. The precursor gas acts as a first element source and a second element source.

A fluorine (F)-containing gas is supplied from the gas supply pipe 232*b* into the process chamber 201 via the MFC 241*b*, the valve 243*b*, and the nozzle 249*b*. The F-containing gas acts as a modifying gas.

As a reaction gas which is a film-forming gas, for example, a nitriding gas (nitriding agent) such as a nitrogen (N)- and hydrogen (H)-containing gas, an oxidizing gas (oxidizing agent) such as an oxygen (O)-containing gas, a carbon (C)-containing gas, or the like is supplied from the gas supply pipe 232*c* into the process chamber 201 via the MFC 241*c*, the valve 243*c*, and the nozzle 249*c*. Since the reaction gas may contain the above-mentioned second element, it may also act as the second element source. Further, the reaction gas is a compound including a molecular structure different from that of the precursor gas.

An aminosilane-based gas (hereinafter, referred to as an "AS gas"), which is a gas containing Si and an amino group, as a Si-containing gas, is supplied from the gas supply pipe 232*g* into the process chamber 201 via the MFC 241*g*, the valve 243*g*, the gas supply pipe 232*c*, and the nozzle 249*c*. The Si-containing gas acts as a modifying gas.

An inert gas is supplied from the gas supply pipes 232*d* to 232*f* into the process chamber 201 via the MFCs 241*d* to

241*f*, the valves 243*d* to 243*f*, the gas supply pipes 232*a* to 232*c*, and the nozzles 249*a* to 249*c*, respectively. The inert gas acts as a purge gas, a carrier gas, a dilution gas, or the like.

A film-forming gas supply system (a precursor gas supply system or a reaction gas supply system) mainly includes the gas supply pipes 232*a* and 232*c*, the MFCs 241*a* and 241*c*, and the valves 243*a* and 243*c*. A Si-containing gas supply system (AS gas supply system) mainly includes the gas supply pipe 232*g*, the MFC 241*g*, and the valve 243*g*. AF-containing gas supply system mainly includes the gas supply pipe 232*b*, the MFC 241*b*, and the valve 243*b*. An inert gas supply system mainly includes the gas supply pipes 232*d* to 232*f*, the MFCs 241*d* to 241*f*, and the valves 243*d* to 243*f*. The Si-containing gas supply system and the F-containing gas supply system may be referred to as a modifying gas supply system.

One or all of various supply systems described above may be configured as an integrated supply system 248 in which the valves 243*a* to 243*g*, the MFCs 241*a* to 241*g*, and the like are integrated. The integrated supply system 248 is connected to each of the gas supply pipes 232*a* to 232*g* such that a supply operation of various types of gases into the gas supply pipes 232*a* to 232*g* (that is, an opening/closing operation of the valves 243*a* to 243*g*, a flow rate regulating operation by the MFCs 241*a* to 241*g* or the like) is controlled by a controller 121 which will be described later. The integrated supply system 248 is configured as an integral type or division type integrated unit, and may be attached to or detached from the gas supply pipes 232*a* to 232*g* or the like on an integrated unit basis, such that maintenance, replacement, expansion or the like of the integrated supply system 248 may be performed on the integrated unit basis.

The exhaust port 231*a* configured to exhaust an internal atmosphere of the process chamber 201 is installed at a lower side of the sidewall of the reaction tube 203. As illustrated in FIG. 2, the exhaust port 231*a* is installed at a position facing the nozzles 249*a* to 249*c* (the gas supply holes 250*a* to 250*c*) in the plane view, with the wafers 200 interposed therebetween. The exhaust port 231*a* may be installed between the lower portion and the upper portion of the sidewall of the reaction tube 203, that is, along the wafer arrangement region. An exhaust pipe 231 is connected to the exhaust port 231*a*. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be regulated by adjusting an opening degree of the APC valve 244 based on pressure information detected by the pressure sensor 245 while operating the vacuum pump 246. An exhaust system mainly includes the exhaust pipe 231, the APC valve 244, and the pressure sensor 245. The vacuum pump 246 may be regarded as being included in the exhaust system.

A seal cap 219, which serves as a furnace opening lid configured to be capable of hermetically sealing a lower end opening of the manifold 209, is installed under the manifold 209. The seal cap 219 is made of a metal material such as stainless steel (SUS) or the like, and is formed in a disc shape. An O-ring 220*b*, which is a seal member making contact with the lower end portion of the manifold 209, is installed on an upper surface of the seal cap 219. A rotation mechanism 267 configured to rotate a boat 217 to be described below is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up or down.

A shutter 219*s* as a furnace opening lid capable of hermetically sealing the lower end opening of the manifold 209, with the boat 217 unloaded from the interior of the process chamber 201 by moving the seal cap 219 down, is installed under the manifold 209. The shutter 219*s* is made of a metal material such as stainless steel or the like, and is formed in a disc shape. An O-ring 220*c* as a seal member making contact with the lower end portion of the manifold 209 is installed on an upper surface of the shutter 219*s*. An opening/closing operation (an up-down movement operation, a rotational movement operation, or the like) of the shutter 219*s* is controlled by a shutter opening/closing mechanism 115*s*.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is regulated such that the interior of the process chamber 201 has a desired temperature distribution. The temperature sensor 263 is installed along the inner wall of the reaction tube 203.

Figure 3:
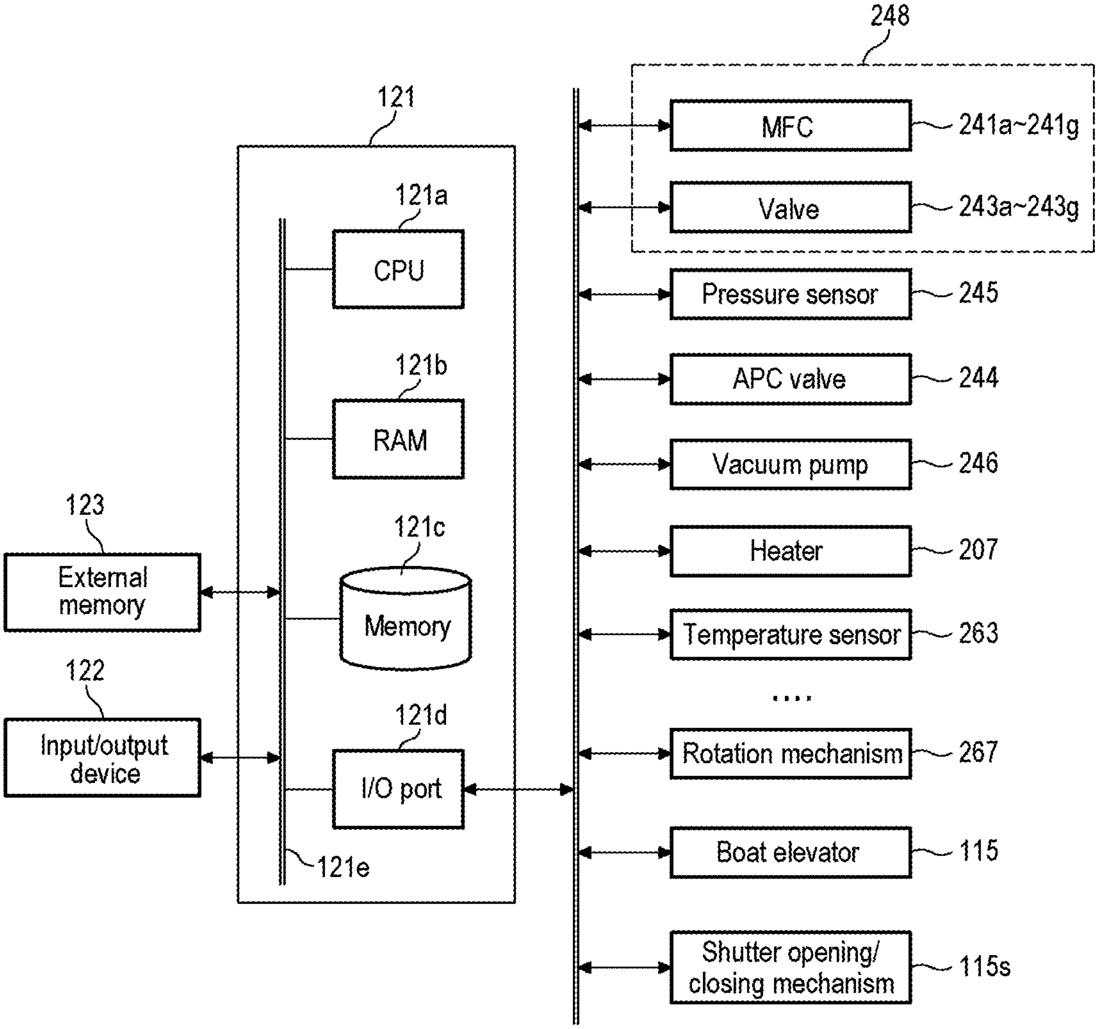
FIG. 3 is a schematic configuration diagram of a controller 121 of a substrate processing apparatus suitably used in some embodiments of the present disclosure, in which a control system of the controller 121 is shown in a block diagram.

As illustrated in FIG. 3, the controller 121, which is a control part (control means), may be configured as a computer including a central processing unit (CPU) 121*a*, a random access memory (RAM) 121*b*, a memory 121*c*, and an I/O port 121*d*. The RAM 121*b*, the memory 121*c* and the I/O port 121*d* are configured to be capable of exchanging data with the CPU 121*a* via an internal bus 121*e*. An input/output device 122 configured as, for example, a touch panel or the like, is connected to the controller 121.

The memory 121*c* includes, for example, a flash memory, a hard disk drive (HDD), a solid state drive (SSD), or the like. A control program that controls operations of a substrate processing apparatus, a process recipe in which sequences, conditions, and the like of substrate processing to be described below are described, and the like are readably stored in the memory 121*c*. The process recipe functions as a program configured to be capable of causing the controller 121 to execute each sequence in the substrate processing to be described below, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121*b* is configured as a memory area (work area) in which a program, data and the like read by the CPU 121*a* are temporarily stored.

The I/O port 121*d* is connected to the MFCs 241*a* to 241*g*, the valves 243*a* to 243*g*, the pressure sensor 245, the APC valve 244, the vacuum pump 246, the temperature sensor 263, the heater 207, the rotation mechanism 267, the boat elevator 115, the shutter opening/closing mechanism 115*s*, and the like, as described above.

The CPU 121*a* is configured to read the control program from the memory 121*c* and execute the same. The CPU 121*a* also reads the recipe from the memory 121*c* according to an input of an operation command from the input/output device 122. In addition, the CPU 121*a* is configured to control, according to the contents of the recipe thus read, the flow rate regulating operation of various types of gases by the MFCs 241*a* to 241*g*, the opening/closing operation of the valves 243*a* to 243*g*, the opening/closing operation of the APC valve 244, the pressure regulating operation performed by the APC valve 244 based on the pressure sensor 245, the driving and stopping of the vacuum pump 246, the temperature regulating operation performed by the heater 207 based on the temperature sensor 263, the operation of rotating the boat 217 and adjusting the rotation speed of the boat 217 with the rotation mechanism 267, the operation of moving the boat 217 up or down with the boat elevator 115, the operation of opening and closing the shutter 219*s* with the shutter opening/closing mechanism 115*s*, and the like.

The controller 121 may be configured by installing, on the computer, the aforementioned program stored in an external memory 123. The external memory 123 may include, for example, a magnetic disc such as a HDD, an optical disc such as a CD, a magneto-optical disc such as a MO, a semiconductor memory such as a USB memory, a SSD, and the like. The memory 121*c* or the external memory 123 is configured as a computer-readable recording medium. Hereinafter, the memory 121*c* and the external memory 123 will be generally and simply referred to as a "recording medium." When the term "recording medium" is used herein, it may indicate a case of including only the memory 121*c*, a case of including only the external memory 123, or a case of including both the memory 121*c* and the external memory 123. Furthermore, the program may be supplied to the computer by using a communication means such as the Internet or a dedicated line, instead of using the external memory 123.

(2) Substrate Processing

As a process of manufacturing a semiconductor device by using the above-described substrate processing apparatus, a processing sequence example of selective growth (selective film formation) selectively growing and forming a film on a surface of a specific base among a plurality of types of bases exposed on a surface of a wafer 200 as a substrate will be described with reference to FIGS. 1 to 4 and 5A to 5E. In the following descriptions, operations of respective parts constituting the substrate processing apparatus are controlled by the controller 121.

Figure 4:
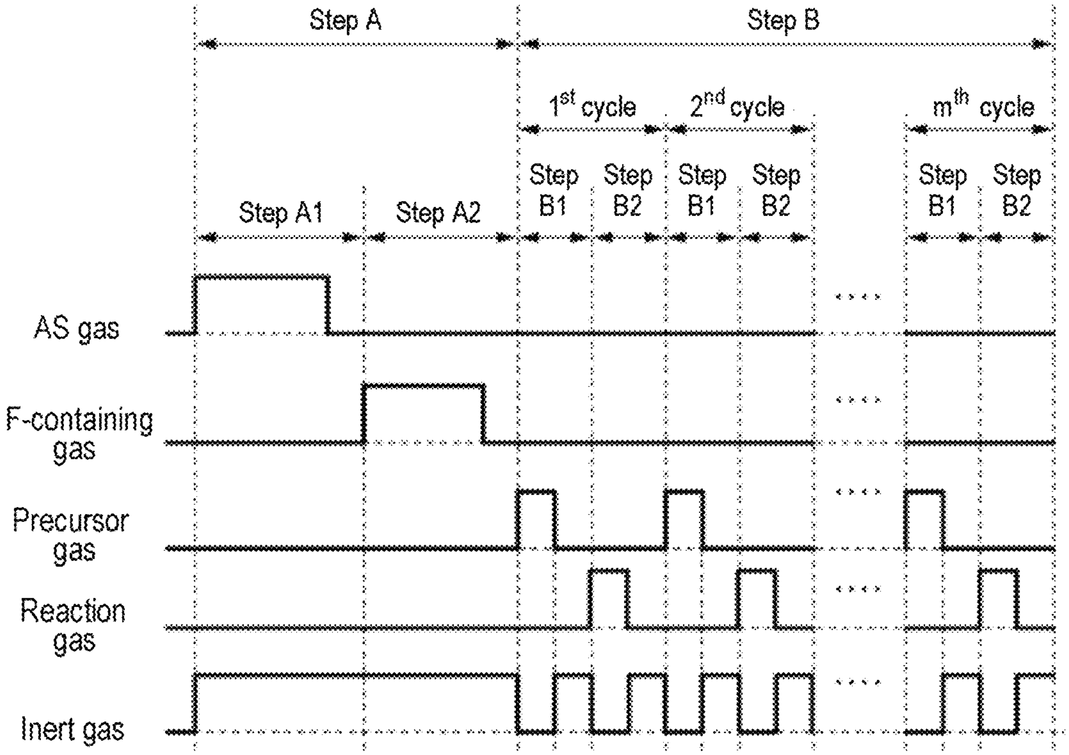
FIG. 4 is a diagram illustrating a processing sequence of selective growth according to some embodiments of the present disclosure.

The processing sequence shown in FIG. 4 includes:

(a) modifying a surface of a base 200*a* exposed on a surface of a wafer 200 by supplying an AS gas, which is a Si-containing gas, and a F-containing gas, as a modifying gas, to the wafer 200 including the base

200*a* as a first base and a base 200*b* as a second base exposed on the surface of the wafer 200 (step A); and (b) a step of selectively forming a film containing at least a first element and a second element different from the first element on a surface of the base 200*b* by supplying a precursor gas and a reaction gas to the wafer 200 after the surface of the base 200*a* is modified under a condition that a film-forming reaction by thermal decomposition of the precursor gas does not substantially occur, the precursor gas containing a compound in which two or more atoms of the first element are contained in one molecule, at least one atom of the second element is interposed between two atoms of the first element, and each of the two atoms of the first element is directly bonded to one of the at least one atom of the second element (step B).

Further, FIG. 4 shows an example in which in the step A, (a1) a step A1 of supplying the AS gas to the wafer 200 and (a2) a step A2 of supplying the F-containing gas to the wafer 200 are sequentially performed. However, depending on the processing condition, it is possible to modify the surface of the base 200*a* with the F-containing gas alone. In that case, the step A1 may not be performed and only the step A2 may be performed.

Further, FIG. 4 shows an example in which in the step B, a cycle including non-simultaneously performing: (b1) a step B1 of supplying the precursor gas to the wafer 200; and (b1) a step B2 of supplying the reaction gas to the wafer 200 is performed a predetermined number of times (n times, where n is an integer of 1 or more). Further, as the reaction gas, a gas of a compound including a molecular structure different from that of the precursor is used.

In the present disclosure, for the sake of convenience, the above-described processing sequence may be denoted as follows. The same denotation may be used in other embodiments, modifications, and the like to be described below.

$$\text{AS gas} \rightarrow \text{F-containing gas} \rightarrow (\text{precursor gas} \rightarrow \text{reaction gas}) \times n$$

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer and the like formed on a wafer". When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

(Wafer Charging and Boat Loading)

When the boat 217 is charged with a plurality of wafers 200 (wafer charging), the shutter 219*s* is moved by the shutter opening/closing mechanism 115*s* to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220*b*.

Figure 5A:
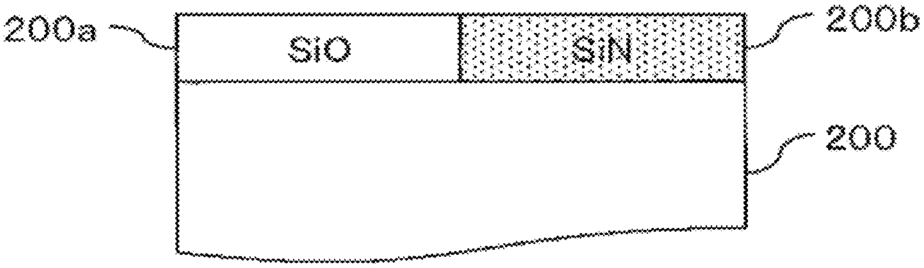
FIG. 5A is a partial enlarged cross-sectional view of a surface of a wafer 200 including a base 200*a* including a silicon oxide film and a base 200*b* including a silicon nitride film each exposed on a surface of the wafer 200.

As illustrated in FIG. 5A, a plurality of types of bases exist on a surface of a wafer 200. In the present disclosure, for example, the base 200*a* including the SiO film as an oxygen (O)-containing film (that is, an oxide film), and the base 200*b* including the SiN film as a nitride film, which is an O-free film (that is, a non-oxidizing film), are exposed in advance on the surface of the wafer 200. The base 200*a* has a surface terminated with a hydroxyl group (OH) over the entire area (entire surface). The base 200*b* has a surface not terminated with OH in many areas, that is, a surface terminated with OH in some areas. By using the wafer 200 including the oxide film and a film (for example, the nitride film) other than the oxide film as the base 200*a* and the base 200*b* respectively, it is possible to achieve the above-mentioned effects (that is, the effects of improving selectivity and productivity in the selective growth) more prominently.

(Pressure Regulation and Temperature Regulation)

After the loading of the boat 217 into the process chamber 201 is completed, the interior of the process chamber 201, that is, a space where the wafers 200 are placed, is vacuum-exhausted (decompression-exhausted) by the vacuum pump 246 to reach a desired pressure (vacuum degree). In this operation, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired processing temperature. In this operation, a degree of supplying electric power to the heater 207 is feedback-controlled based on the temperature information detected by the temperature sensor 263 such that the interior of the process chamber 201 has a desired temperature distribution. Further, rotation of the wafers 200 by the rotation mechanism 267 begins. The exhaust of the interior of the process chamber 201 and the heating and rotation of the wafers 200 are continuously performed at least until the processing on the wafers 200 is completed.

(Selective Growth)

Subsequently, the following steps A and B are executed in this order.

[Step A]

At this step, the surface of the base 200*a* is modified by supplying the AS gas and the F-containing gas as a modifying gas in this order to the wafer 200 including the base 200*a* and the base 200*b* exposed on the surface of the wafer 200. In the step A, step A1 of supplying the AS gas to the wafer 200 and step A2 of supplying the F-containing gas to the wafer 200 are performed in this order. By performing the step A1 and the step A2 in this order, it is possible to uniformly and sufficiently modify (F-terminate) the surface of the base 200*a*.

In the step A, each process may be performed under a non-plasma atmosphere. By performing each process in the step A under the non-plasma atmosphere, the modified surface of the base 200*a* formed in the step A can be prevented from being destructured (specifically, the F-termination can be prevented from being partially eliminated or the F-termination can be prevented from being denatured or altered).

Hereinafter, the step A1 and the step A2 will be described in detail.

[Step A1]

In the step A1, the AS gas as a Si-containing gas is supplied to the wafer 200 in the process chamber 201, that is, the wafer 200 including the base 200*a* and the base 200*b* exposed on the surface of the wafer 200. Thus, Si contained in the AS gas is adsorbed on the surface of the base 200*a*.

After the pressure regulation and the temperature regulation in the process chamber 201 are completed, the AS gas is supplied to the wafer 200 in the process chamber 201, that is, the wafer 200 including the base 200*a* and the base 200*b* exposed on the surface of the wafer 200.

Specifically, the valve 243*g* is opened to allow the AS gas to flow through the gas supply pipe 232*g*. A flow rate of the AS gas is regulated by the MFC 241*g*. The AS gas is supplied into the process chamber 201 via the gas supply pipe 232*c* and the nozzle 249*c* and is exhausted from the exhaust port 231*a*. At this time, the AS gas is supplied to the wafer 200 (AS gas supply). At this time, the valves 243*d* to 243*f* are opened to supply an inert gas into the process chamber 201 via the nozzles 249*a* to 249*c* respectively. The supply of the inert gas may not be performed.

Processing conditions in this step may be exemplified as follows:

AS gas supply flow rate: 1 to 2,000 sccm, specifically 1 to 500 sccm in some embodiments AS gas supply time: 1 second to 60 minutes Inert gas supply flow rate (for each gas supply pipe): 0 to 10,000 sccm Processing temperature: room temperature (25 degrees C.) to 600 degrees C., specifically room temperature to 450 degrees C. in some embodiments Processing pressure: 1 to 2,000 Pa, specifically 1 to 1,000 Pa in some embodiments The conditions described here are conditions in which the AS gas does not undergo vapor phase decomposition (thermal decomposition) in the process chamber 201.

Further, in the present disclosure, an expression of a numerical range such as “1 to 2,000 Pa” may mean that a lower limit value and an upper limit value are included in that range. Therefore, for example, “1 to 2,000 Pa” may mean “1 Pa or higher and 2,000 Pa or lower.” The same applies to other numerical ranges.

Figure 5B:
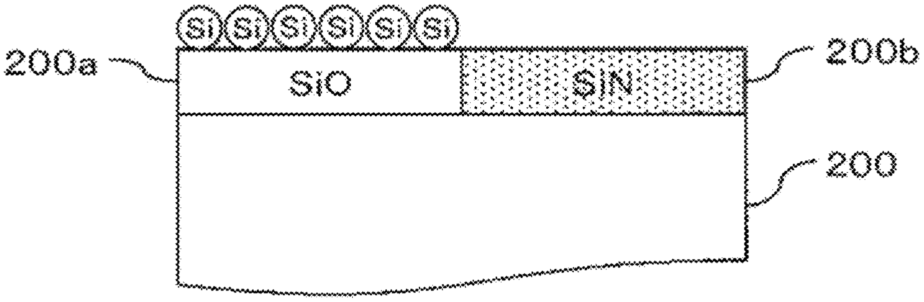
FIG. 5B is a partial enlarged cross-sectional view of the surface of the wafer 200 after silicon is selectively adsorbed on a surface of the base 200*a* by supplying an aminosilane-based gas.

By supplying the AS gas to the wafer 200 under the aforementioned conditions, as illustrated in FIG. 5B, Si contained in the AS gas may be selectively (that is, preferentially) adsorbed on the surface of the base 200*a* while suppressing Si contained in the AS gas from being adsorbed on the surface of the base 200*b*. At this time, Si contained in the AS gas may be adsorbed on a portion of the surface of the base 200*b*, but an adsorption amount of Si becomes smaller than an adsorption amount of Si on the surface of the base 200*a*. Such selective (that is, preferential) adsorption is possible because the processing conditions at this step are set to the conditions under which the AS gas is not gas-phase decomposed in the process chamber 201. Further, the selective adsorption is possible because the surface of the base 200*a* is OH-terminated over the entire region, whereas many regions of the surface of the base 200*b* are not OH-terminated (some regions of the surface are OH-terminated). At this step, since the AS gas is not gas-phase decomposed in the process chamber 201, Si contained in the AS gas is not multiple-deposited on the surfaces of the bases 200*a* and 200*b*. At this step, on the surface of the base 200*a*, the OH termination formed on the entire region of the surface reacts with the AS gas to cause Si contained in the AS gas to be chemisorbed on the entire region of the surface of the base 200*a*. On the other hand, since the OH termination does not exist in many regions of the surface of the base 200*b*, Si contained in the AS gas is not chemisorbed in those many regions. However, the OH termination formed in some regions of the surface of the base 200*b* and the AS gas may react with each other to cause Si contained in the AS gas to be chemisorbed on the regions.

Further, when the supply of the AS gas is continued for a predetermined period of time, the chemisorption of Si on the surface of the base 200*a* is saturated. That is, the chemisorption of Si on the surface of the base 200*a* is self-limited. In other words, when a Si layer having a saturation thickness is formed on the surface of the base 200*a*, Si is no longer chemisorbed on the surface of the base 200*a*. As a result, the amount of Si adsorbed on the surface of the base 200*a* becomes substantially uniform over the entire region of the surface of the base 200*a*. By using the AS gas as the modifying gas in the step A1, the surface of the base 200*a* can be more uniformly and sufficiently modified (F-terminated) in the step A2.

After Si is selectively adsorbed on the surface of the base 200*a*, the valve 243*g* is closed to stop the supply of the AS gas into the process chamber 201. Then, the interior of the process chamber 201 is vacuum-exhausted and the gas or the like remaining within the process chamber 201 is removed from the interior of the process chamber 201. At this time, the valves 243*d* to 243*f* are opened to supply an inert gas into the process chamber 201 via the nozzles 249*a* to 249*c*. The inert gas supplied from the nozzles 249*a* to 249*c* acts as a purge gas. Thus, the interior of the process chamber 201 is purged (purge).

As the AS gas, a gas of an aminosilane compound represented by the following chemical formula [1] may be used.

$$SiA_x[(NB_2)_{(4-x)}] \quad [1]$$

In the chemical formula [1], "A" represents a hydrogen (H) atom, an alkyl group, or an alkoxy group, "B" represents a H atom or an alkyl group, and "x" represents an integer of 1 to 3. The alkyl group represented by "A" may be specifically an alkyl group containing 1 to 5 carbon atoms in some embodiments, more specifically an alkyl group containing 1 to 4 carbon atoms in some embodiments. The alkyl group represented by A may have a straight-chain form or a branched form. Examples of the alkyl group represented by A may include a methyl group, an ethyl group, an n-propyl group, an n-butyl group, an isopropyl group, an isobutyl group, a sec-butyl group, a tert-butyl group, and the like. The alkoxy group represented by A may be specifically an alkoxy group containing 1 to 5 carbon atoms in some embodiments, more specifically an alkoxy group containing 1 to 4 carbon atoms in some embodiments. An alkyl group in the alkoxy group represented by A is the same as the alkyl group represented by A. When x is 2 or 3, two or three A's may be the same or different. The alkyl group represented by B is the same as the alkyl group represented by A. Further, two B's may be the same or different, and when x is 1 or 2, a plurality of ($NB_2$) may be the same or different. Further, the two B's may be bonded to form a ring structure, and the formed ring structure may further contain a substituent such as an alkyl group.

As the AS gas, it may be possible to use, for example, a monoaminosilane ($SiH_3(NR_2)$, abbreviation: MAS) gas in which A in the chemical formula [1] is a H atom and x is 3 (that is, a compound containing one amino group in one molecule), a bisaminosilane ($SiH_2(NR_2)_2$, abbreviation: BAS) gas in which A in the chemical formula [1] is a H atom and x is 2 (that is, a compound containing two amino groups in one molecule), or a trisaminosilane ($SiH(NR_2)_3$, abbreviation: TAS) gas in which A in the chemical formula [1] is a H atom and x is 1 (a compound containing three amino groups in one molecule). Among them, the MAS gas may be used as the AS gas in some embodiments. By using the MAS gas as the modifying gas in the step A1, it is possible to more uniformly and sufficiently modify (F-terminate) the surface of the base 200*a* in the step A2.

As the MAS gas, it may be possible to use, for example, an ethylmethylaminosilane ($SiH_3[N(CH_3)(C_2H_5)]$) gas, a dimethylaminosilane ($SiH_3[N(CH_3)_2]$) gas, a diisopropylaminosilane ($SiH_3[N(C_3H_7)_2]$) gas, a disecondarybutylaminosilane ($SiH_3[H(C_4H_9)_2]$) gas, a dimethylpiperidinosilane ($SiH_3[NC_5Hg(CH_3)_2]$) gas, or a diethylpiperidinosilane ($SiH_3[NC_5Hg(C_2H_5)_2]$) gas.

In the AS gas including the MAS gas, since the amino group (that is, ($NB_2$) in the chemical formula [1]) is bonded to the Si atom which is the central atom in the molecule, this amino group is also called a ligand or an amino ligand.

As the inert gas, it may be possible to use, in addition to the $N_2$ gas, a rare gas such as an argon (Ar) gas, a helium (He) gas, a neon (Ne) gas, or a xenon (Xe) gas. This also applies to each step as described below.

[Step A2]

At step A2, the surface of the wafer 200 is modified by supplying the F-containing gas to the wafer 200 to cause the F-containing gas to react with Si adsorbed on the surface of the base 200*a*, such that the surface of the wafer 200 is fluorine-terminated (F-terminated).

After step A1 is completed, the F-containing gas is supplied to the wafer 200 in the process chamber 201, that is, the wafer 200 after Si is selectively adsorbed on the surface of the base 200*a*. Specifically, the valve 243*b* is opened to allow the F-containing gas to flow through the gas supply pipe 232*b*. A flow rate of the F-containing gas is regulated by the MFC 241*b*. The F-containing gas is supplied into the process chamber 201 via the nozzle 249*b* and is exhausted from the exhaust port 231*a*. At this time, the F-containing gas is supplied to the wafer 200 (F-containing gas supply). At this time, the valves 243*d* and 243*f* may be opened to supply an inert gas into the process chamber 201 via the nozzles 249*a* and 249*c*. The supply of the inert gas may not be performed.

Processing conditions at this step may be exemplified as follows;

F-containing gas supply flow rate: 1 to 2,000 sccm, specifically 1 to 500 sccm in some embodiments F-containing gas supply time: 1 second to 60 minutes Processing temperature: room temperature to 550 degrees C., specifically room temperature to 450 degrees C. in some embodiments Processing pressure: 1 to 2,000 Pa, specifically 1 to 1,000 Pa in some embodiments Other conditions may be similar to those of the processing conditions at step A1. The conditions described herein are conditions under which the surface of the base 200*a* is not etched, and are conditions under which the surface of the base 200*a* is modified (F-terminated), as will be described later.

By supplying the F-containing gas to the wafer 200 under the aforementioned conditions, the surface of the base 200*a* may be modified to be F-terminated, without being etched, by causing the F-containing gas to react with Si adsorbed on the surface of the base 200*a* at step A1.

The modified base 200*a* has a F-terminated (or SiF-terminated) surface (corresponding to the aforementioned modified surface). Further, when attention is paid to atoms existing on the outermost surface of the modified base 200*a*, it may be said that the base 200*a* has a F-terminated surface. In addition, when attention is paid to the atoms existing on the outermost surface of the modified base 200*a* and atoms bonded to the atoms, it may be said that the base 200*a* has a SiF-terminated surface. In the present disclosure, the former expression will be mainly used for the sake of convenience. As the surface of the base 200*a* is F-terminated, the film-forming reaction does not progress on the surface of the base 200*a* at step B as described below. Exactly, the time until the film-forming reaction occurs, that is, an incubation time, may be prolonged.

Further, in a case where organic components contained in the AS gas remain on the surface of the base 200*a*, when Si adsorbed on the surface of the base 200*a* reacts with the F-containing gas, the organic components are removed from the surface of the base 200*a*.

Figure 5C:
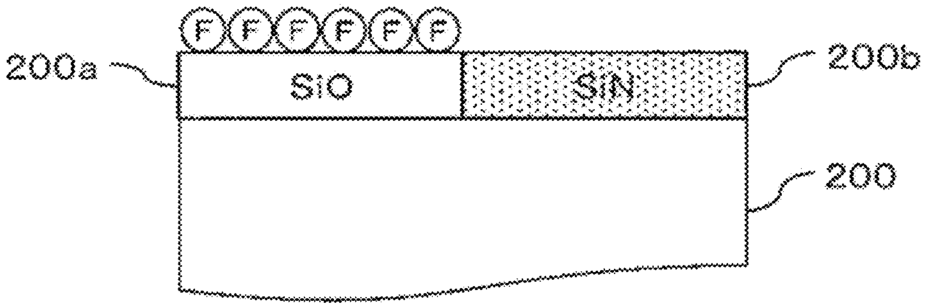
FIG. 5C is a partial enlarged cross-sectional view of the surface of the wafer 200 after the surface of the base 200*a* on which silicon is adsorbed is selectively modified by supplying a fluorine-containing gas.

As illustrated in FIG. 5C, at this step, the surface of the base 200*a* may be selectively (that is, preferentially) modified while suppressing the modification of the surface of the base 200*b*. At this time, a portion of the surface of the base 200*b* may be modified, but its modification amount becomes smaller than a modification amount of the surface of the base 200*a*.

Such selective (that is, preferential) modification is possible because Si is not adsorbed on many regions of the surface of the base 200*b* after performing step A1, whereas Si is adsorbed on the entire region of the surface of the base 200*a*. Since Si is not adsorbed on many regions of the surface of the base 200*b*, the reaction between Si and the F-containing gas does not progress, and as a result, the F termination is not formed in those many regions. However, as described above, Si may be adsorbed on some regions of the surface of the base 200*b*, and in that case, the F termination may be formed on the regions. On the other hand, on the entire region of the surface of the base 200*a*, Si adsorbed on the surface reacts with the F-containing gas to generate F-containing radicals, and a very stable F termination (that is, a SiF termination obtained by a reaction between Si and F) is formed on the entire region of the surface by an action of such radicals. Examples of the F-containing radicals may include F, SiF, $SiF_2$, $SiF_3$, SiHF, $SiH_2F$, $SiHF_2$, and the like.

Further, as described above, the amount of Si adsorbed on the surface of the base 200*a* at step A1 is set substantially uniform over the entire region of the surface of the base 200*a*. Therefore, at this step, the amount of the F-containing radicals generated on the surface of the base 200*a* becomes substantially uniform over the entire in-plane region of the surface. As a result, the modification of the base 200*a* described above progresses substantially uniformly over the entire region of the surface of the base 200*a*.

In addition, since Si is not adsorbed on many regions of the surface of the base 200*b* as described above, the reaction between Si and the F-containing gas does not progress and F-containing radicals are not generated, and therefore the regions are not modified. However, when Si is adsorbed on some regions of the surface of the base 200*b*, Si and the F-containing gas react with each other in the regions to generate the F-containing radicals, and the regions may be modified as described above. As a result, the surface of the base 200*b* is hardly damaged by etching, and adsorption sites are maintained in many regions of the surface.

After the surface of the base 200*a* out of the bases 200*a* and 200*b* is selectively modified, the valve 243*b* is closed to stop the supply of the F-containing gas into the process chamber 201. Then, the gas or the like, which remains within the process chamber 201, is removed from the interior of the process chamber 201 according to the same processing procedures as those of the purge at step A1.

As the F-containing gas, it may be possible to use a fluorine ($F_2$) gas, a chlorine trifluoride ($ClF_3$) gas, a $ClF_3$ gas+NO gas, a chlorine fluoride gas (ClF) gas, a $F_2$+nitric oxide (NO) gas, a ClF+NO gas, a nitrogen trifluoride ($NF_3$) gas, a tungsten hexafluoride ($WF_6$) gas, a nitrosyl fluoride (FNO) gas, or a mixture thereof.

[Step B]

In this step, the above-mentioned precursor gas and reaction gas are supplied as film-forming gases on the wafer 200 after the surface of the base 200*a* is modified in the step A, under a condition that film-forming reaction by thermal decomposition of the precursor gas does not substantially occur, a film containing at least a first element and a second element is selectively formed on the surface of the base 200*b*. In the step B, a cycle including non-simultaneously performing: a step B1 of supplying the precursor gas to the wafer 200; and a step B2 of supplying the reaction gas to the wafer 200 is performed a predetermined number of times (n times, where n is an integer of 1 or more).

In the step B, each process may be performed under a non-plasma atmosphere. By performing each process in the step B under the non-plasma atmosphere, decomposition of the precursor gas is suppressed to prevent the modified surface of the base 200*a* modified in the step A from being destructed (specifically, the F-termination may be prevented from being partially desorbed or from being denatured or altered).

[Step B1]

At step B1, a precursor gas is supplied to the wafer 200 in the process chamber 201, that is the wafer 200 after the surface of the base 200*a* out of the bases 200*a* and 200*b* is selectively modified.

Specifically, the valve 243*a* is opened to allow a precursor gas to flow through the gas supply pipe 232*a*. A flow rate of the precursor gas is regulated by the MFC 241*a*. The precursor gas is supplied into the process chamber 201 via the nozzle 249*a* and is exhausted from the exhaust port 231*a*. At this time, the precursor gas is supplied to the wafer 200 (precursor gas supply). At this time, the valves 243*d* to 243*f* may be opened to supply the inert gas into the process chamber 201 via the nozzles 249*a* to 249*c*.

In this step, the processing conditions are set to the condition that the film-forming reaction by the thermal decomposition of the precursor gas does not substantially occur. By performing this step under such a condition, it is possible to prevent the destruction of the modified surface of the base 200*a* obtained by the modification in the step A. This is because, under such a condition, the film-forming gas is not easily decomposed by heat, which does not generate radical components such as active intermediates, such that reaction leading to the destruction of the modified surface (that is, F-termination) by the radical components is suppressed.

Specifically, Processing conditions in this step may be exemplified as follows:

Precursor gas supply flow rate: 1 to 2,000 sccm, specifically 10 to 1,000 sccm in some embodiments Precursor gas supply time: 1 to 180 seconds, specifically 10 to 120 seconds in some embodiments Processing temperature: 350 degrees C. to 600 degrees C., specifically 400 degrees C. to 550 degrees C. in some embodiments Processing pressure: 1 to 2,000 Pa, specifically 10 to 1,333 Pa Other processing conditions may be the same as those of the processing conditions in the step A1.

These conditions are conditions that when a compound expressed by formula (1) or (2) to be described below is used as the precursor gas, film-forming reaction by thermal decomposition of the precursor gas does not substantially occur.

In the present disclosure, the phrase "film-forming reaction by thermal decomposition of the precursor gas does not substantially occur" means that slight thermal decomposition of the precursor gas occurs unintentionally and film-forming reaction caused by such thermal decomposition is allowed. Therefore, "a condition that film-forming reaction by thermal decomposition of the precursor gas does not substantially occur" includes, for example a condition that slight thermal decomposition of the precursor gas may occur unintentionally even at a temperature lower than a thermal decomposition temperature of a compound used as the precursor gas.

In more detail, as the processing conditions in this step, the processing temperature may be lower than the thermal decomposition temperature of the compound used as the precursor gas. The processing temperature may be specifically a temperature lower than the thermal decomposition temperature of the compound used as the precursor gas by 1 to 5 degrees C. or more in some embodiments, or more specifically a temperature lower than the thermal decomposition temperature of the compound used as the precursor gas by 1 to 10 degrees C. or more. A lower limit of the processing temperature may be a temperature at which the precursor gas can be chemisorbed.

By supplying the precursor gas to the wafer 200 under the above-mentioned conditions, a first element- and second element-containing layer is formed as a first layer on the surface of the base 200*b* including an unmodified area of the bases 200*a* and 200*b*. That is, the first element- and second element-containing layer is formed starting from the unmodified area of the base 200*b*, that is, an area where an adsorption site is maintained. The first element- and second element-containing layer is formed by physisorption or chemisorption of molecules of the precursor gas on the surface of the base 200*b*, chemisorption of molecules of a substance obtained by partially decomposing the precursor gas, deposition of atoms of the first element and atoms of the second element by thermal decomposition of the precursor gas, and the like. The first element- and the second element-containing layer may be an adsorption layer (physisorption layer or chemisorption layer) of molecules of the precursor gas or molecules of a substance obtained by partially decomposing the precursor gas, a deposition layer of atoms of the first element or atoms of the second element, or a mixture thereof. Further, the first element- and second element-containing layer may include physisorption or chemisorption of molecules of the precursor gas or chemisorption of molecules of a substance obtained by partially decomposing the precursor gas, on the surface of the base 200*b* in some embodiments.

In this step, it is possible to selectively form the first element- and second element-containing layer on the surface of the base 200*b* while suppressing formation of the first element- and second element-containing layer on the surface of the base 200*a*. In addition, in a case where the surface of the base 200*a* is insufficiently modified for some reason, the first element- and second element-containing layer may be formed very slightly on the surface of the base 200*a*, but even in which case, a thickness of the first element- and second element-containing layer formed on the surface of the base 200*a* is much smaller than a thickness of the first element- and second element-containing layer formed on the surface of the base 200*b*. Such selective formation of the first element- and second element-containing layer is possible because the F-termination existing on the surface of the base 200*a* acts as a factor inhibiting formation of the first element- and second element-containing layer (for example, adsorption of atoms of the first element) on the surface of the base 200*a*, that is, as an inhibitor (adsorption inhibitor or adsorption suppressor). Further, the F-termination existing on the surface of the base 200*a* is stably maintained even when this step is performed.

After the first element- and second element-containing layer is formed on the surface of the base 200*b*, the valve 243*a* is closed to stop the supply of the precursor gas into the process chamber 201. Then, a gas and the like remaining in the process chamber 201 are removed from the process chamber 201 according to the same processing procedure as that in the purge in the step A1 (purge).

As described above, a compound (hereinafter, also referred to as a compound for precursor gas) in which two or more atoms of the first element are contained in one molecule, at least one atom of the second element is interposed between two atoms of the first element, and each of the two atoms of the first element is directly bonded to one of the at least one atom of the second element different from the first element is used as the precursor gas (film-forming gas). By using such a compound for precursor gas, it is possible to increase a deposition rate due to the above-mentioned molecular structure.

This may be because, for example, under the above-mentioned conditions, it is possible to cause at least a portion of the compound for precursor gas to be adsorbed on the adsorption site on the surface of the base 200*b* in a form that two or more atoms of the first element (for example, Si) are vertically stacked via at least one atom of the second element. When at least a portion of the compound for precursor gas is adsorbed on the surface of the base 200*b* in such a form, a layer to be formed (first layer) can be made thicker than that in a case where a compound containing only one atom of the first element in one molecule is adsorbed. As a result, it is possible to form a film on the surface of the base 200*b* at a high deposition rate.

The compound for precursor gas may not contain a bond between atoms of the first element (for example, a Si—Si bond) in some embodiments. Further, the compound for precursor gas may include a structure in which two atoms of the first element are directly bonded to one atom of the second element, or a structure in which two atoms of the first element are directly bonded to atoms of the second element bonded to each other respectively in some embodiments. It is possible to secure a stability of the precursor gas, that is, the compound for precursor gas, under the above-mentioned conditions, more in the case where the precursor not containing the bond between atoms of the first element but including the structure in which two atoms of the first element are directly bonded to one atom of the second element or including the structure in which two atoms of the first element are directly bonded to atoms of the second element bonded to each other respectively, is used than in a case where a precursor gas containing the bond between atoms of the first element is used. As a result, it is possible to increase a rate of realizing the above-described adsorption state in the compounds for precursor gas, that is, the adsorption state in which two or more atoms of the first element are vertically stacked via at least one atom of the second element. This also makes it possible to increase the deposition rate.

Further, in the compound for precursor gas, the first element may be a semiconductor element or a metal element, and the second element may be nitrogen (N), oxygen (O), or carbon (C). When the first element and the second element are these elements respectively, it is possible to achieve the above-described effects (that is, the effects of improving the selectivity and productivity in the selective growth) more prominently.

More specifically, the compound for precursor gas may be at least one selected from the group of compounds represented by formula (1) or (2):

$$X_3A\text{-}Y\text{-}AX_3 \quad (1)$$

$$X_3A\text{-}Z\text{-}AX_2\text{-}Z\text{-}AX_3 \quad (2)$$

In the formulas, "A" is an atom of the first element represented by a silicon (Si) atom, a germanium (Ge) atom, or a tetravalent metal atom, "X" represents a chlorine (Cl) atom, a bromine (Br) atom, an iodine (I) atom, $NR_2$, or OR, independently, "R" represents a hydrogen (H) atom or an alkyl group containing 1 to 5 carbon atoms, independently, "Y" represents NH, O, $CH_2$, or $CH_2—CH_2$, and two Z's represent NH, O, or $CH_2$, respectively. In Y and Z, a nitrogen (N) atom in NH, an oxygen (O) atom in O, and carbon (C) atoms in $CH_2$ and $CH_2—CH_2$ are atoms of the second element.

In the formulas (1) and (2), the tetravalent metal atom represented by A may include a titanium (Ti) atom, a zirconium (Zr) atom, a hafnium (Hf) atom, a molybdenum (Mo) atom, a tungsten (W) atom, or the like.

Specifically, A in the formulas (1) and (2) may be a Si atom or a Ge atom, more specifically the Si atom in some embodiments.

In the formulas (1) and (2), $NR_2$ represented by X may be an alkyl-substituted amino group in which at least one selected from the group of two R's is an alkyl group containing 1 to 5 carbon atoms, or an unsubstituted amino group in which both of two R's may be are H atoms. However, $NR_2$ may be the alkyl-substituted amino group in which at least one selected from the group of the two R's is the alkyl group containing 1 to 5 carbon atoms. In the formulas (1) and (2), R of OR represented by X may be an alkyl group containing 1 to 5 carbon atoms. The alkyl group represented by R may be an alkyl group containing 1 to 4 carbon atoms. Examples of the alkyl group represented by R may include a methyl group, an ethyl group, an n-propyl group, an n-butyl group, an isopropyl group, an isobutyl group, a sec-butyl group, a tert-butyl group, and the like.

More specifically, the compound for precursor gas may be at least one selected from the group of compounds represented by any one of the following formulas (a) to (g):

$$X_3A\text{-}NH\text{-}AX_3 \quad (a)$$

$$X_3A\text{-}NH\text{-}AX_2\text{-}NH\text{-}AX_3 \quad (b)$$

$$X_3A\text{-}O\text{-}AX_3 \quad (c)$$

$$X_3A\text{-}O\text{-}AX_2\text{-}O\text{-}AX_3 \quad (d)$$

$$X_3A\text{-}CH_2\text{-}AX_3 \quad (e)$$

$$X_3A\text{-}CH_2\text{-}AX_2—CH_2\text{-}AX_3 \quad (f)$$

$$X_3A\text{-}CH_2—CH_2\text{-}AX_3 \quad (g)$$

In the formulas, A is an atom of the first element represented by a Si atom, a Ge atom, or a tetravalent metal atom, X represents a Cl atom, a Br atom, an I atom, $NR_2$, or OR, independently, and R represents a H atom or an alkyl group containing 1 to 5 carbon atoms, independently. In the formulas, a N atom in —NH—, an O atom in —O—, and carbon (C) atoms in $—CH_2—$ and $—CH_2—CH_2—$ are atoms of the second element.

A, X, and R in the formulas (a) to (g) are synonymous with A, X, and R in the formulas (1) and (2).

Specific examples of the compound represented by the formula (1) may include compounds represented by any one of the formulas (a), (c), (e), and (g). In addition, specific examples of the compound represented by the formula (2) may include compounds represented by any one of the formulas (b), (d), and (f).

Examples of the compound represented by the formula (1) may include hexachlorodisilazane ($SiCl_3NSiCl_3$, abbreviation: HCDSN), hexachlorodisiloxane ($SiCl_3OSiCl_3$, abbreviation: HCDSO), bis(trichlorosilyl)methane ($SiCl_3CH_2SiCl_3$, abbreviation: BTCSM), 1,2-bis(trichlorosilyl)ethane ($SiCl_3CH_2CH_2SiCl_3$, abbreviation: BTCSE), and the like. Examples of the compound represented by the formula (2) may include octachlorotrisiloxane ($SiCl_3OSiCl_2OSiCl_3$, abbreviation: OCTSO) and the like.

By using the compound represented by the formula (1) or the formula (2) (that is, the compound represented by any one of the formulas (a) to (g)) as the precursor gas, it is possible to achieve the above-described effects (that is, the effects of improving the selectivity and productivity in the selective growth) more prominently.

Further, the compound for precursor gas may contain at least one selected from the group of Si—N—Si bond, Si—N—Si—N—Si bond, Si—O—Si bond, Si—O—Si—O—Si bond, Si—C—Si bond, Si—C—Si—C—Si bond, and Si—C—C—Si bond. When the compound for precursor gas contains at least one selected from the group of the above-mentioned bonds, it is possible to achieve the above-described effects (that is, the effects of improving the selectivity and productivity in the selective growth) more prominently.

[Step B2]

In the step B2, the reaction gas is supplied to the wafer 200 in the process chamber 201, that is, the first element- and second element-containing layer as the first layer formed on the base 200*b*.

Specifically, the valve 243*c* is opened to allow the reaction gas to flows through the gas supply pipe 232*c*. A flow rate of the reaction gas is regulated by the MFC 241*c*, and the reaction gas is supplied into the process chamber 201 via the nozzle 249*c* and is exhausted via the exhaust port 231*a*. In this operation, the reaction gas is supplied to the wafer 200 (reaction gas supply). At this time, the valves 243*d* to 243*f* may be opened to allow an inert gas to be supplied into the process chamber 201 via the respective nozzles 249*a* to 249*c*.

Processing conditions in this step are exemplified as follows:

Reaction gas supply flow rate: 10 to 10,000 sccm

Reaction gas supply time: 1 to 60 seconds, specifically 5 to 50 seconds in some embodiments Processing temperature: 350 degrees C. to 600 degrees C., specifically 400 degrees C. to 550 degrees C. in some embodiments Processing pressure: 1 to 4,000 Pa, specifically 1 to 1,333 Pa Other processing conditions are the same as the processing conditions in the step A1.

By supplying the reaction gas to the wafer 200 under the above-mentioned conditions, at least a portion of the first element- and second element-containing layer as the first layer formed on the surface of the base 200_b_ reacts with the reaction gas. When the first element- and second element-containing layer reacts with the reaction gas, a composition ratio between the first element and the second element in the first element- and second element-containing layer changes, such that a first element- and second element-containing layer having a desired composition ratio is formed as a second layer on the surface of the base 200_b_. When the second layer is formed, impurities such as Cl contained in the first layer form a gaseous substance containing at least Cl in a process of reaction between the reaction gas and the first layer and are discharged from the process chamber 201. As a result, the first element- and second element-containing layer as the second layer becomes a layer containing fewer impurities such as Cl than the first element- and second element-containing layer as the first layer formed in the step B1. Further, the surface of the base 200_a_ is maintained without reacting with the reaction gas even when this step is performed. That is, the surface of the base 200_a_ is stably maintained while being F-terminated.

Further, as described above, the reaction gas may contain the second element. When the reaction gas contains the second element, it is possible to control the composition ratio such that a percentage (concentration) of the second element in the first layer increases by reaction between the reaction gas with the first layer. As a result, it is possible to control the composition ratio such that the percentage (concentration) of the second element in the finally obtained first element- and second element-containing film increases.

Further, the reaction gas may contain a third element different from the first element and the second element. When the reaction gas contains the third element, the reaction gas reacts with the first layer to newly add the third element to the first layer, which makes it possible to control the composition ratio such that at least one selected from the group of the respective percentages (concentrations) of the first element and the second element in the first layer decreases. In other words, the reaction gas reacts with the first layer to change the first layer into a first element-, second element-, and third element-containing layer, which makes it possible to control the composition ratio such that at least one selected from the group of the respective percentages (concentrations) of the first element and the second element in the first layer decreases. As a result, it is possible to control the composition ratio such that at least one selected from the group of the respective percentages (concentrations) of the first element and the second element in the finally obtained first element-, second element-, and third element-containing film decreases.

After the second layer is formed on the surface of the base 200_b_, the valve 243_c_ is closed to stop the supply of the reaction gas into the process chamber 201. Then, a gas and the like remaining in the process chamber 201 are removed from the process chamber 201 according to the same processing procedure as the purge in the step A1 (purge).

As the reaction gas (film-forming gas), it may be possible to use, for example, a N- and H-containing gas such as an ammonia ($NH_3$) gas, a diazene ($N_2H_2$) gas, a hydrazine ($N_2H_4$) gas, or a $N_3H_8$ gas, that is, a hydrogen nitride-based gas. Further, as the reaction gas (film-forming gas), it may be possible to use, for example, an O-containing gas such as an oxygen ($O_2$) gas, an ozone ($O_3$) gas, water vapor ($H_2O$), a hydrogen peroxide ($H_2O_2$) gas, a nitric oxide (NO) gas, or a nitrous oxide ($N_2O$) gas. Further, as the reaction gas (film-forming gas), it may be possible to use, for example, a C-containing gas such as a propylene ($C_3H_6$) gas, a N- and C-containing gas such as a triethylamine ($(C_2H_5)_3N$, abbreviation: TEA) gas, or a boron (B)-containing gas such as a trichloroborane ($BCl_3$) gas.

By using these reaction gases, it is possible to form, for example, a film such as a silicon nitride film (SiN film), a silicon oxide film (SiO film), a silicon oxynitride film (SiON film), a silicon carbide film (SiC film), a silicon carbonitride film (SiCN film), a silicon oxycarbonitride film (SiOCN film), a silicon oxycarbide film (SiOC film), a silicon boronitride film (SiBN film), a silicon borocarbonitride film (SiBCN film), a germanium nitride film (GeN film), a germanium oxide film (GeO film), a germanium oxynitride film (GeON film), a germanium carbide film (GeC film), a titanium nitride film (TiN film), a titanium oxide film (TIO film), a titanium oxynitride film (TiON film), a titanium carbide film (TiC film), a tungsten nitride film (WN film), a tungsten oxide film (WO film), a tungsten oxynitride film (WON film), a tungsten carbide film (WC film), a molybdenum nitride film (MoN film), a molybdenum oxide film (MoO film), a molybdenum oxynitride film (MoON film), a molybdenum carbide film (MoC film), a zirconium nitride film (ZrN film), a zirconium oxide film (ZrO film), a zirconium oxynitride film (ZrON film), a zirconium carbide film (ZrC film), a hafnium nitride film (HfN film), a hafnium oxide film (HfO film), a hafnium oxynitride film (HfON film), or a hafnium carbide film (HfC film) on the surface of the base 200_b_.

[Performing Predetermined Number of Times]

Figure 5D:
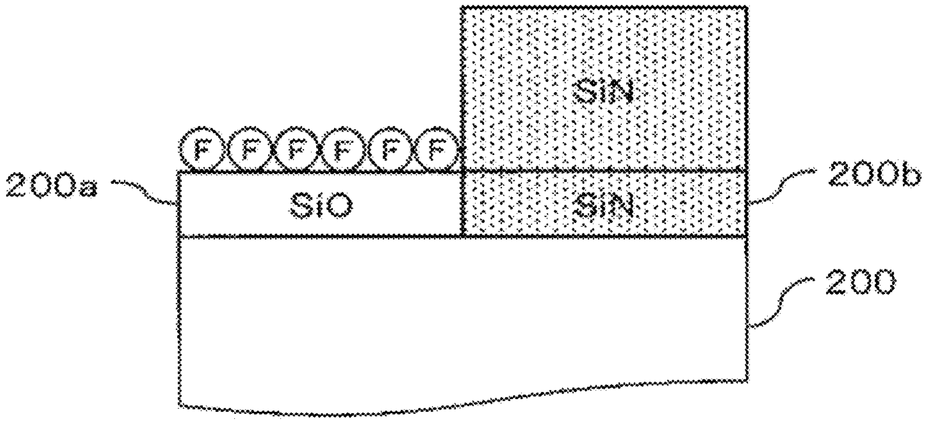
FIG. 5D is a partial enlarged cross-sectional view of the surface of the wafer 200 after a silicon nitride film is selectively formed on a surface of the base 200*b* for selective growth by supplying a film-forming gas.

By performing a cycle a predetermined number of times (n times, where n is an integer of 1 or more), the cycle including non-simultaneously, that is, without synchronization, performing the above-mentioned steps B1 and B2, a first element- and second element-containing film (hereinafter, also simply referred to as a film) may be selectively formed on the surface of the base 200_b_ of the bases 200_a_ and 200_b_ exposed on the surface of the wafer 200, as shown in FIG. 5D. FIG. 5D shows an example in which the first element is Si and the second element is N, that is, an example in which a SiN film is selectively formed on the surface of the base 200_b_. The above cycle may be performed a plurality of times. That is, the thickness of the first element- and second element-containing layer formed per cycle is made thinner than a desired film thickness, and the above cycle may be performed a plurality of times until the film thickness of a film formed by laminating the first element- and second element-containing layers reaches a desired film thickness.

When the steps B1 and B2 are performed, the F-termination existing on the surface of the base 200_a_ is stably maintained, so that no film is formed on the surface of the base 200_a_. However, in a case where the surface of the base 200_a_ is insufficiently modified for some reason, a film may be very slightly formed on the surface of the base 200_a_. However, even in this case, the thickness of the film formed on the surface of the base 200_a_ is much smaller than the thickness of the film formed on the surface of the base 200_b_. In the present disclosure, the phrase "selectively forming a film on the surface of the base 200_b_" of the bases 200_a_ and 200_b_ may include not only a case where no film is formed on the surface of the base 200_a_, but also the case where a very thin film is formed on the surface of the base 200_a_, as described above.

(After-Purge and Returning to Atmospheric Pressure)

After the selective formation of the first element- and second element-containing film on the base 200_b_ is completed, the inert gas as the purge gas is supplied from each of the nozzles 249_a_ to 249_c_ into the process chamber 201 and is exhausted from the exhaust port 231*a*. Thus, the interior of the process chamber 201 is purged and the gas or the reaction byproduct remaining within the process chamber 201 is removed from the interior of the process chamber 201 (after-purge). Thereafter, the internal atmosphere of the process chamber 201 is substituted by the inert gas (inert gas substitution), and the internal pressure of the process chamber 201 is returned to an atmospheric pressure (returning to atmospheric pressure return).

(Boat Unloading and Wafer Discharging)

After the internal pressure of the process chamber 201 is returned to the atmospheric pressure, the seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219*s* is moved such that the lower end opening of the manifold 209 is sealed by the shutter 219*s* via the O-ring 220*c* (shutter closing). The processed wafers 200 are unloaded to the outside of the reaction tube 203, and are subsequently discharged from the boat 217 (wafer discharging).

Figure 5E:
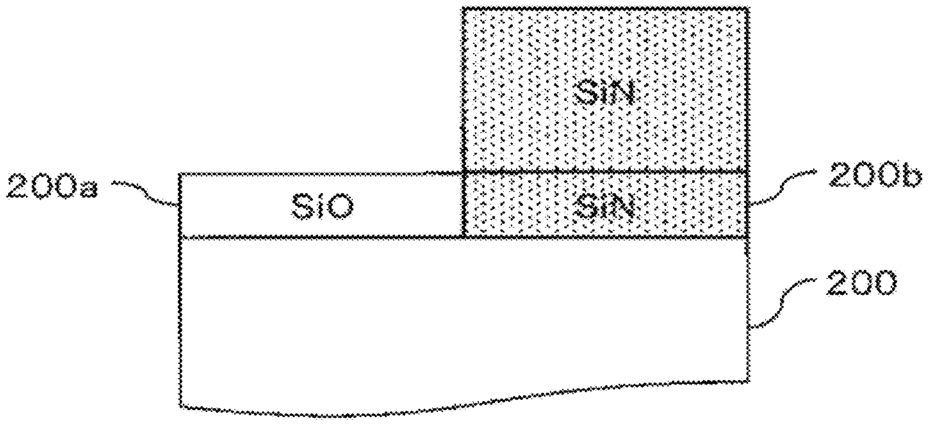
FIG. 5E is a partial enlarged cross-sectional view of the surface of the wafer 200 after the wafer 200 illustrated in FIG. 5D is exposed to an atmosphere.

Further, as illustrated in FIG. 5E, the F termination existing on the surface of the base 200*a* is eliminated by being brought into contact with and reacting with a predetermined substance (reactant) reacting with F, specifically, moisture ($H_2O$) in the air, when the processed wafers 200 are exposed to the air. That is, the F termination existing on the surface of the base 200*a* may be removed by the exposure of the processed wafers 200 to the air. By removing the F termination from the surface of the base 200*a*, the surface state of the base 200*a* is reset. As a result, the film-forming process may progress on the surface of the base 200*a* at subsequent steps.

(3) Effects According to Embodiments

According to the embodiments of the present disclosure, one or more effects as set forth below may be achieved.

By performing steps A and B in this order, it becomes possible to selectively form the first element- and second element-containing film on the surface of the base 200*b* out of the bases 200*a* and 200*b* exposed on the surface of the wafer 200. This makes it possible to simplify processes, for example, omit a patterning process including photolithography when manufacturing a semiconductor device. As a result, it becomes possible to improve the productivity of the semiconductor device and to reduce a manufacturing cost.

At step A1, an amount of Si to be selectively (that is, preferentially) adsorbed on the surface of the base 200*a* may be set to be substantially uniform over the entire region of the surface of the base 200*a*. This makes it possible to substantially uniformly modify the entire region of the surface of the base 200*a* at the whole step A. As a result, it becomes possible to substantially uniformly inhibit the formation of the first element- and second element-containing film on the surface of the base 200*a* over the entire region of the surface of the base 200*a* at the subsequent step B. That is, it is possible to enhance a selectivity in selective growth.

By performing the step A and the step B in this order, it is possible to form the first element- and second element-containing film on the surface of the base 200*b* at a high deposition rate while suppressing the destruction of the F-termination (that is, the modified surface) on the surface of the base 200*a* modified in the step A. This makes it possible to improve the selectivity and productivity in the selective growth.

Other Embodiments of the Present Disclosure

The embodiments of the present disclosure have been specifically described above However, the present disclosure is not limited to the above-described embodiments, but may be differently modified without departing from the gist of the present disclosure.

Figure 6:
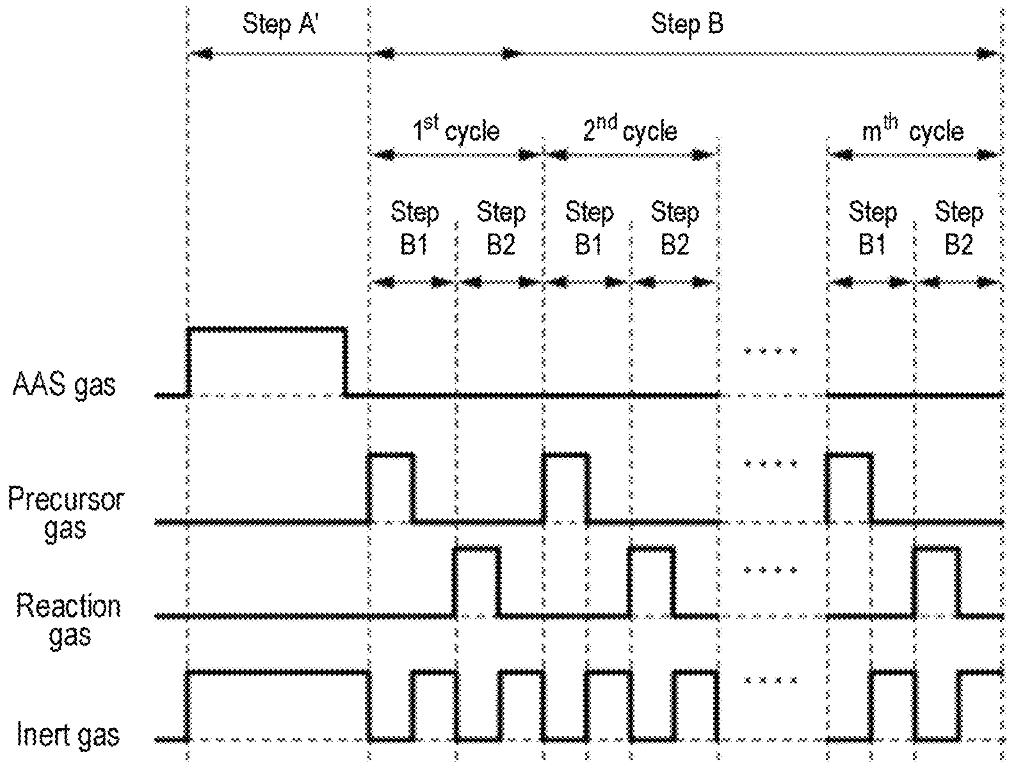
FIG. 6 is a diagram showing a processing sequence of selective growth according to some other embodiments of the present disclosure.

For example, as in the processing sequence illustrated in FIG. 6, instead of step A, step A' of modifying a surface of a base 200*a* exposed on a surface of a wafer 200 by supplying a hydrocarbon group-containing gas as a modifying gas to the wafer 200 including the base 200*a* and a base 200*b* exposed on the surface of the wafer 200 may be performed. In this case, the surface of the base 200*a* is not F-terminated as at step A, but is modified to be terminated with a hydrocarbon group. That is, at step A', the hydrocarbon group (termination of the hydrocarbon group) is used as the inhibitor.

As the hydrocarbon group-containing gas, it may be possible to use, for example, a gas containing an alkyl group. As the gas containing the alkyl group, it may be possible to use, for example, a gas containing an alkylsilyl group in which an alkyl group is coordinated to Si, that is, an alkylsilane-based gas. Examples of the alkyl group may include a methyl group, an ethyl group, a propyl group, a butyl group, and the like. As the alkyl group is bonded to Si which is the central atom of the alkylsilane molecule, the alkyl group in alkylsilane may be referred to as a ligand or an alkyl ligand.

The hydrocarbon group-containing gas may further contain an amino group. That is, a gas of a compound containing a hydrocarbon group and an amino group may be used as a modifying gas. As the gas of the compound containing the hydrocarbon group and the amino group, it may be possible to use, for example, an alkylaminosilane-based gas (hereinafter, referred to as an AAS gas). By using the gas of the compound containing the hydrocarbon group and the amino group as the modifying gas, among the hydrocarbon group-containing gases, it is possible to terminate the surface of the base 200*a* with hydrocarbon group more uniformly and sufficiently in the step A'. In this case, the processing sequence shown in FIG. 6 may also be denoted as follows.

AAS gas→(precursor gas→reaction gas)×n

Further, the AAS gas is a type of aminosilane-based gas and may be supplied from the above-described aminosilane-based gas supply system.

Hereinafter, step A' will be described in detail.

At this step, an AAS gas is supplied to the wafer 200 in the process chamber 201, that is, the wafer 200 including the base 200*a* and the base 200*b* exposed on its surface.

Specifically, the opening/closing control of the valves 243*g*, 243*d* and 243*e* is performed in the same procedure as the opening/closing control of the valves 243*g*, 243*d* and 243*e* at step A1. A flow rate of the AAS gas is regulated by the MFC 241*g*. The AAS gas is supplied into the process chamber 201 via the nozzle 249*c* and is exhausted from the exhaust port 231*a*. At this time, the AAS gas is supplied to the wafer 200 (AAS gas supply). The supply of an inert gas into the process chamber 201 is performed in the same manner as at step A1. The supply of the inert gas may not be performed, as at step A1.

Processing conditions in this step may be exemplified as follows:

AAS gas supply flow rate: 1 to 3,000 sccm, specifically 1 to 500 sccm in some embodiments AAS gas supply time: 1 second to 120 minutes, specifically 30 seconds to 60 minutes in some embodiments Inert gas supply flow rate (for each gas supply pipe): 0 to 20,000 sccm Processing temperature: room temperature (25 degrees C.) to 500 degrees C., specifically room temperature to 250 degrees C. in some embodiments Processing pressure: 5 to 1,000 Pa By supplying the AAS gas to the wafer 200 under the aforementioned conditions, the surface of the base 200*a* out of the bases 200*a* and 200*b* may be selectively (that is, preferentially) modified. Specifically, an OH group terminating the surface of the base 200*a* may react with the AAS gas while suppressing the adsorption of Si contained in the AAS gas on the surface of the base 200*b*, to cause Si contained in the AAS gas to be adsorbed on the surface of the base 200*a* selectively (that is, preferentially). This makes it possible to terminate the surface of the base 200*a* with an alkyl group contained in AAS, that is, a hydrocarbon group. For example, when the AAS gas is a trialkylaminosilane gas, it is possible to terminate the surface of the base 200*a* with a trialkylsilyl group ($Si—R_3$) contained in the AAS gas. The alkyl group (trialkylsilyl group) terminating the surface of the base 200*a* acts as an inhibitor that prevents the adsorption of the precursor gas on the surface of the base 200*a* and inhibits the progress of the film-forming reaction on the surface of the base 200*a* in the selective growth.

Further, at this step, Si contained in the AAS gas is adsorbed on a portion of the surface of the base 200*b* and the portion of the surface of the base 200*b* may be terminated with an alkyl group but its termination amount is small, and a termination amount of the surface of the base 200*a* with the alkyl group becomes overwhelmingly larger. Such selective (that is, preferential) termination becomes possible because the processing conditions at this step are set to conditions under which the AAS gas is not gas-phase decomposed in the process chamber 201. Further, such selective termination becomes possible because the surface of the base 200*a* is OH-terminated over the entire region whereas many regions of the surface of the base 200*b* are not OH-terminated. At this step, since the AAS gas is not gas-phase decomposed in the process chamber 201, Si contained in AAS gas is not multiple-deposited on the surfaces of the bases 200*a* and 200*b* and Si contained in AAS gas is selectively adsorbed on the surface of the base 200*a*, thus selectively terminating the surface of the base 200*a* with the alkyl group.

After the surface of the base 200*a* is modified, the valve 243*g* is closed to stop the supply of the AAS gas into the process chamber 201. Then, the gas or the like remaining within the process chamber 201 is removed from the process chamber 201 according to the same processing procedures as those of the purge at step A1.

As the hydrocarbon group-containing gas, it may be possible to use, for example, a gas of a compound containing one amino group and three hydrocarbon groups in one molecule. Specifically, as the hydrocarbon group-containing gas, it may be possible to use, for example, an alkylaminosilane-based gas containing one amino group and three alkyl groups in one molecule, such as a dimethylaminotrimethylsilane ($(CH_3)_2NSi(CH_3)_3$, abbreviation: DMATMS) gas or a diethylaminotriethylsilane ($(C_2H_5)_2NSi(C_2H_5)_3$, abbreviation: DEATES) gas. Three hydrocarbon groups (methyl groups) and one amino group (dimethylamino group) are bonded to Si, which is the central atom of DMATMS. Three hydrocarbon groups (ethyl groups) and one amino group (diethylamino group) are bonded to Si, which is the central atom of DEATES. In this way, DMATMS and DEATES contain three alkyl ligands and one amino ligand. As the hydrocarbon group-containing gas, in addition to the DMATMS gas and the DEATES gas, for example, an aminosilane compound represented by the aforementioned formula [1] may be used. By using a compound containing one amino group and three hydrocarbon groups in one molecule as the hydrocarbon group-containing gas, it is possible to -terminate the surface of the base 200*a* with the hydrocarbon group more uniformly and sufficiently in the step A'.

Then, by performing each process including the step B in the aforementioned embodiments, the same selective growth as in the aforementioned embodiments can be performed.

After the step B is performed, the hydrocarbon group-termination existing on the surface of the base 200*a* may be removed. For example, after the step B is performed, an annealing process, a nitriding process, an oxidizing process, a plasma process, and the like may be performed under a temperature higher than the processing temperature in the step B to remove the hydrocarbon group termination existing on the surface of the base 200*a*. The annealing process may be performed under an inert gas atmosphere in some embodiments. The nitriding process may be performed under a N- and H-containing gas atmosphere in some embodiments. The oxidizing process may be performed under an O-containing gas atmosphere in some embodiments. The plasma process may be performed under an atmosphere of at least one selected from the group of an inert gas, a N- and H-containing gas, and an O-containing gas in some embodiments. The aforementioned various types of gases may be used as the inert gas, the N- and H-containing gas, and the O-containing gas. The plasma process may also be performed under a temperature equal to or lower than the processing temperature in the step B. For example, the plasma process may be performed under the same temperature as the processing temperature in the step B and further may be performed under room temperature. By removing the hydrocarbon group termination from the surface of the base 200*a*, a surface state of the base 200*a* is reset.

Even in these embodiments, the same effects as those of the aforementioned embodiments may be achieved. Further, in these embodiments, since the processing time in the step A' may be shortened as compared with the processing time in the step A, the productivity can be further improved. Further, in these embodiments, since one type of gas may be used to perform modifying in the step A', the gas supply system may be simplified, thereby significantly reducing the apparatus costs.

Variations of the Aforementioned Embodiments

The examples in which the F termination existing on the surface of the base 200*a* is removed by exposing the processed wafer 200 to the atmosphere have been described in the aforementioned embodiments. However, for example, after the step B is completed, a $H_2O$ gas may be supplied to the wafer 200 in the process chamber 201 and brought into contact with the surface of the wafer 200 to remove the F-termination existing on the surface of the base 200*a*.

Further, for example, in addition to the base 200*a* containing the SiO film and the base 200*b* containing the SiN film, a base including a semiconductor thin film such as a Si film, a germanium film (Ge film), and a silicon germanium film (SiGe film), or a base containing a conductive metal thin film such as a tungsten film (W film), a tungsten nitride film (WN film), and a titanium nitride film (TiN film) may be exposed on the surface of the wafer 200. Further, instead of the base 200*b* including the SiN film, the base including the semiconductor thin film or the metal thin film described above may be exposed. Even in these cases, the same effects as those of the aforementioned embodiments may be achieved. That is, a film may be selectively formed on the surface of the SiN film or on the surface of the semiconductor thin film or the metal thin film described above while avoiding the film formation on the SiO film.

Further, for example, at step A1, a MAS gas, a BAS gas or a TAS gas may be used as the AS gas, and even in this case, the same effects as those of the aforementioned embodiments may be achieved. However, at step A1, as the number of amino groups contained in one molecule in a gas used as the AS gas becomes smaller, an adsorption density of Si on the surface of the base 200*a* becomes higher, and a density of SiF termination formed on the surface of the base 200*a* becomes higher at step A. As a result, it is possible to enhance the film-forming inhibition effect on the surface of the base 200*a* at step B. In this regard, a MAS gas in which one amino group is contained in one molecule may be used as the AS gas in some embodiments.

In addition, for example, at step B, before starting the cycle which non-simultaneously performs steps B1 and B2, a step (reaction gas preflow) of supplying, for a predetermined period of time, a reaction gas to the wafer 200 in the process chamber 201, that is, the wafer 200 after the surface of the base 200*a* out of the base 200*a* and the base 200*b* is selectively modified, may be performed. Even in this case, since the F termination or the hydrocarbon group termination existing on the surface of the base 200*a* is stably maintained, the same effects as those of the aforementioned embodiments may be achieved. Furthermore, since the adsorption site on the surface of the base 200*b* may be optimized, it is possible to improve a quality of the film formed on the base 200*b*.

Further, for example, in the step B, as the reaction gas, in addition to the N- and H-containing gas such as the $NH_3$ gas, it may be possible to use an O-containing gas such as an $O_2$ gas, a N- and C-containing gas such as a TEA gas, a C-containing gas such as a $C_3H_6$ gas, or a B-containing gas such as a $BCl_3$ gas. Further, in the step B, a catalyst gas such as a pyridine ($C_5HSN$, abbreviation: py) gas may be used. Further, two or more types of these gases, that is, a plurality of types of gases, may be used as reaction gases. For example, the C-containing gas, the N- and H-containing gas, and the O-containing gas may be used as a first reaction gas, a second reaction gas, and a third reaction gas, respectively.

By using these gases in the step B to perform the processing sequences shown below, it is possible to form, for example, a film such as a SiN film, a SiCN film, a SiBN film, a SiBCN film, a SiON film, a SiOCN film, or a SiOC film on the surface of the unmodified base 200*b* of the bases 200*a* and 200*b*.

AS gas → F-containing gas → (precursor gas → reaction gas) × n

AS gas → F-containing gas → (precursor gas + catalyst gas → reaction gas) × n

AS gas → F-containing gas → (precursor gas → reaction gas + catalyst gas) × n

-continued

AS gas → F-containing gas → (precursor gas + catalyst gas → reaction gas + catalyst gas) n AS gas → F-containing gas → (precursor gas → first reaction gas → second reaction gas) × n AS gas → F-containing gas → (precursor gas → first reaction gas → second reaction gas → third reaction gas) × n AAS gas → (precursor gas → reaction gas) × n AAS gas → (precursor gas + catalyst gas → reaction gas) × n AAS gas → (precursor gas → reaction gas + catalyst gas) × n AAS gas → (precursor gas + catalyst gas → reaction gas + catalyst gas) × n AAS gas → (precursor gas → first reaction gas → second reaction gas) × n AAS gas → (precursor gas → first reaction gas → second reaction gas → third reaction gas) × n Further, even in these embodiments, the same effects as those of the aforementioned embodiments may be achieved.

Further, when the F-termination is used as an inhibitor, a gas (an $NH_3$ gas or the like) other than the gas containing an OH group, such as the $H_2O$ gas, may be used as the reaction gas in some embodiments. This is because in a case where the $H_2O$ gas or the like is used as the reaction gas when the F termination is used as the inhibitor, the F termination may react with the $H_2O$ gas to remove the inhibitor.

On the other hand, when the hydrocarbon group termination is used as the inhibitor, the inhibitor is not removed even when the $H_2O$ gas or the like is used as the reaction gas. Therefore, when the $H_2O$ gas or the like is used as the reaction gas, the hydrocarbon group-termination may be used as the inhibitor in some embodiments. Further, when the hydrocarbon group termination is used as the inhibitor, a gas (an $NH_3$ gas or the like) other than the gas containing the OH group, such as the $H_2O$ gas, may be used as the reaction gas.

Recipes used in each processing may be provided individually according to the processing contents and may be stored in the memory 121*c* via a telecommunication line or the external memory 123. Further, at the start of each processing, the CPU 121*a* may properly select an appropriate recipe from the recipes stored in the memory 121*c* according to the processing contents. Thus, it is possible for a single substrate processing apparatus to form films of various types, composition ratios, qualities, and thicknesses with enhanced reproducibility. In addition, it is possible to reduce an operator's burden and to quickly start each processing while avoiding an operation error The recipes mentioned above are not limited to newly-provided ones but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there have been described examples in which selective growth is performed by using a batch-type substrate processing apparatus capable of processing a plurality of substrates at a time. The present disclosure is not limited to the aforementioned embodiments but may be appropriately applied to, for example, a case where selective growth is performed by using a single-wafer-type substrate processing apparatus capable of processing a single substrate or several substrates at a time. Further, in the aforementioned embodiments, there have been described examples in which selective growth is performed by using the substrate processing apparatus provided with a hot-wall-type process furnace. The present disclosure is not limited to the aforementioned embodiments but may be appropriately applied to a case where selective growth is performed by using a substrate processing apparatus provided with a cold-wall-type process furnace.

Even in the case of using these substrate processing apparatuses, each process may be performed according to the same processing procedures and processing conditions as those in the above embodiments, and the same effects as those of the above embodiments can be achieved.

The aforementioned embodiments may be used in proper combination. The processing procedures and processing conditions used in this case may be the same as, for example, the processing procedures and processing conditions of the aforementioned embodiments.

EXAMPLES

By using the substrate processing apparatus in the aforementioned embodiments, a process of forming a SiN film on a wafer including a base SiO film and a base SiN film exposed on a surface of the wafer is performed according to the processing sequence in the aforementioned embodiments, and an evaluation sample of an Example is produced. The same gases as the various types of gases in the aforementioned embodiments are used as an AS gas, a F-containing gas, a precursor gas, and a reaction gas. Processing conditions are the same as the processing conditions in the aforementioned embodiments. Then, a deposition rate of the SiN film in the evaluation sample of the Example is calculated and a selectivity is checked.

Further, by using the substrate processing apparatus in the aforementioned embodiments, a process of forming a SiN film on a wafer with a base SiO film and a base SiN film exposed on a surface of the wafer is performed according to the processing sequence in the aforementioned embodiments, and an evaluation sample of a Comparative Example is produced. The same gases as the various types of gases in the Example are used as an AS gas, a F-containing gas, and a reaction gas. Instead of the precursor gas in the Example, a gas of a compound containing only one Si in one molecule is used as a precursor gas. Processing conditions are the same as the processing conditions in the aforementioned embodiments. A film thickness of the SiN film formed on the base SiN film is the same as the film thickness of the SiN film formed on the base SiN film in the Example. Then, a deposition rate of the SiN film in the evaluation sample of the Comparative Example was calculated, and a selectivity is checked.

As a result, it was confirmed that the deposition rate of the SiN film on the base SiN film in the evaluation sample of the Example is more than twice the deposition rate of the SiN film on the base SiN film in the evaluation sample of the Comparative Example. Further, in the evaluation sample of the Comparative Example, a slight deposition of the SiN film is observed on the surface of the base SiO film, and an occurrence of selection loss is confirmed. However, in the evaluation sample of the Example, no deposition of the SiN film is observed on the surface of the base SiO film, and it is confirmed that no selection loss occurred.

From these facts, according to the method of the Example, the deposition rate of the SiN film can be made more than twice the deposition rate of the SiN film by the method of the Comparative Example, which turns out that it is possible to significantly improve the productivity.

Further, when the SiN film having the same film thickness is selectively grown, a time until the selection loss occurs by the method of the Example may be more than twice a time until the selection loss occurs by the method of the Comparative Example. That is, according to the method of the Example, an apparent incubation time on the surface of the base SiO film can be made more than twice an incubation time on the surface of the base SiO film by the method of the Comparative Example. As a result, according to the method of the Example, it can be seen that it is possible to significantly improve the selectivity.

According to the present disclosure in some embodiments, it is possible to provide a technique capable of improving selectivity and productivity in selective growth.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:

(a) supplying a modifying gas to a substrate, which includes a first base and a second base on a surface of the substrate, to modify a surface of the first base that is terminated with a hydroxyl group; and (b) forming a film containing at least a first element and a second element different from the first element on a surface of the second base by supplying a precursor gas to the substrate after the surface of the first base is modified, under a condition that a film-forming reaction by thermal decomposition of the precursor gas does not substantially occur, the precursor gas containing a compound in which two or more atoms of the first element are contained in one molecule, at least one atom of the second element is interposed between two atoms of the first element, and each of the two or more atoms of the first element is directly bonded to one of the at least one atom of the second element, wherein in (a), a fluorine-containing gas and a silicon-containing gas are each used as the modifying gas, which modifies the surface of the first base to suppress the film from being formed on the modified surface of the first base, wherein (a) includes:

(a1) supplying the silicon-containing gas to the substrate; and (a2) supplying the fluorine-containing gas to the substrate, and wherein (a1) and (a2) are performed in this order.

2. The method of claim 1, wherein the compound does not contain a bond between the atoms of the first element.

3. The method of claim 1, wherein the compound includes a structure in which the two or more atoms of the first element are directly bonded to one atom of the second element, or a structure in which the two or more atoms of the first element are directly bonded to two atoms of the second element bonded to each other respectively.

4. The method of claim 1, wherein in the compound, the first element is a semiconductor element or a metal element, and the second element is nitrogen, oxygen, or carbon.

5. The method of claim 1, wherein the compound is at least one selected from the group of compounds represented by formula (1) or (2):

$$X_3A\text{-}Y\text{-}AX_3 \quad (1)$$

$$X_3A\text{-}Z\text{-}AX_2\text{-}Z\text{-}AX_3 \quad (2)$$

wherein, in the formulas (1) and (2), A is an atom of the first element represented by a silicon atom, a germanium atom, or a tetravalent metal atom; X represents a chlorine atom, a bromine atom, an iodine atom, $NR_2$, or OR, independently; R represents a hydrogen atom or an alkyl group containing 1 to 5 carbon atoms, independently; Y represents NH, O, $CH_2$, or $CH_2$—$CH_2$; two Zs represent NH, O, or $CH_2$, respectively; and in Y and Z, a nitrogen atom in NH, an oxygen atom in O, and carbon atoms in $CH_2$ and $CH_2$—$CH_2$ are atoms of the second element.

6. The method of claim 1, wherein in the compound, the first element is silicon, the second element is nitrogen, oxygen, or carbon, and the compound contains at least one selected from the group of Si—N—Si bond, Si—N—Si—N—Si bond, Si—O—Si bond, Si—O—Si—O—Si bond, Si—C—Si bond, Si—C—Si—C—Si bond, and Si—C—C—Si bond.

7. The method of claim 1, wherein (b) includes:

performing a cycle a predetermined number of times, the cycle including:

(b1) supplying the precursor gas to the substrate; and (b2) supplying a reaction gas including a molecular structure different from a molecular structure of the precursor gas to the substrate.

8. The method of claim 1, wherein in (a), the fluorine-containing gas as the modifying gas is used to terminate the surface of the first base with fluorine.

9. The method of claim 8, further comprising (c) removing fluorine termination formed on the surface of the first base after (b).

10. The method of claim 1, wherein an aminosilane-based gas is used as the silicon-containing gas.

11. The method of claim 1, wherein the silicon-containing gas is a gas of a compound containing one amino group in one molecule.

12. The method of claim 1, wherein the first base is an oxide film, and the second base is a film other than the oxide film.

13. The method of claim 1, wherein (a) and (b) are performed under a non-plasma atmosphere.

14. A method of manufacturing a semiconductor device, comprising the method of claim 1.

* * * * *